(12) United States Patent
Tseng et al.

(10) Patent No.: US 10,908,817 B2
(45) Date of Patent: Feb. 2, 2021

(54) SIGNAL REDUCTION IN A MICROCONTROLLER ARCHITECTURE FOR NON-VOLATILE MEMORY

(71) Applicant: SANDISK TECHNOLOGIES LLC, Addison, TX (US)

(72) Inventors: Tai-Yuan Tseng, Milpitas, CA (US); Hiroyuki Mizukoshi, Kawasaki (JP); Chi-Lin Hsu, San Jose, CA (US); Yan Li, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 242 days.

(21) Appl. No.: 16/003,515

(22) Filed: Jun. 8, 2018

(65) Prior Publication Data

US 2019/0179532 A1    Jun. 13, 2019

Related U.S. Application Data

(60) Provisional application No. 62/596,680, filed on Dec. 8, 2017.

(51) Int. Cl.
*G06F 3/06* (2006.01)
*G11C 16/10* (2006.01)
(Continued)

(52) U.S. Cl.
CPC .......... *G06F 3/0604* (2013.01); *G06F 3/0655* (2013.01); *G06F 3/0679* (2013.01);
(Continued)

(58) Field of Classification Search
CPC ..... G11C 16/26; G11C 11/5642; G11C 16/10; G11C 16/08; G11C 16/3459; G11C 11/56;
(Continued)

(56) References Cited

U.S. PATENT DOCUMENTS 6,304,101 B1 * 10/2001 Nishihara ........ H03K 19/17758
    326/41
6,487,653 B1 * 11/2002 Oberman ............ G06F 9/30025
    708/508

(Continued)

*Primary Examiner* — Tuan V Thai
*Assistant Examiner* — Edward Waddy, Jr.
(74) *Attorney, Agent, or Firm* — Vierra Magen Marcus LLP

(57) ABSTRACT

An apparatus includes a first processor that generates first control signals to control a first circuit to perform memory operations on memory cells. A first number of first physical signal lines delivers the first control signals to a conversion circuit. A second number of second physical signal lines delivers converted control signals to the first circuit. The conversion circuit is coupled by the first number of first physical signal lines to the first processor and by the second number of second physical signal lines to the first circuit. The conversion circuit converts the first control signals to the converted control signals, and outputs the converted control signals to the first circuit. The first number of first physical signal lines is less than the second number of second physical signal lines to reduce the first number of first physical signal lines coupled between the first processor and the first circuit.

20 Claims, 26 Drawing Sheets

(51) Int. Cl.
- *G11C 16/34* (2006.01)
- *G11C 16/26* (2006.01)
- *G11C 11/56* (2006.01)
- *G11C 5/06* (2006.01)
- *G11C 16/08* (2006.01)
- *G11C 8/12* (2006.01)
- *G11C 7/10* (2006.01)
- *G11C 8/08* (2006.01)
- *G11C 16/04* (2006.01)

(52) U.S. Cl.
CPC ............ *G11C 5/066* (2013.01); *G11C 7/1039* (2013.01); *G11C 8/08* (2013.01); *G11C 8/12* (2013.01); *G11C 11/56* (2013.01); *G11C 11/5642* (2013.01); *G11C 16/08* (2013.01); *G11C 16/10* (2013.01); *G11C 16/26* (2013.01); *G11C 16/3459* (2013.01); *G11C 7/1015* (2013.01); *G11C 16/0483* (2013.01); *G11C 2207/107* (2013.01)

(58) Field of Classification Search
CPC ......... G11C 5/066; G11C 7/1039; G11C 8/08; G11C 8/12; G06F 3/0655; G06F 3/0679; G06F 3/0604

USPC .......................... 711/154, 103, E12.008, 100
See application file for complete search history.

(56) References Cited

U.S. PATENT DOCUMENTS

| | | | |
|---|---|---|---|
| 7,287,148 B2 | 10/2007 | Kanapathippillai et al. | |
| 7,441,101 B1 | 10/2008 | Steiss et al. | |
| 9,432,298 B1 | 8/2016 | Smith | |
| 2004/0184308 A1* | 9/2004 | Kim | G06F 5/06 365/154 |
| 2008/0082900 A1* | 4/2008 | Yoon | G11C 7/1006 714/768 |
| 2008/0225606 A1 | 9/2008 | Heo et al. | |
| 2011/0205805 A1* | 8/2011 | Honma | G11C 11/5628 365/185.22 |
| 2013/0111140 A1* | 5/2013 | Kitahara | G06F 12/0888 711/125 |
| 2014/0241037 A1* | 8/2014 | Kobayashi | G11C 13/0023 365/148 |
| 2015/0019834 A1* | 1/2015 | Loh | G06F 12/023 711/208 |
| 2017/0123558 A1* | 5/2017 | Hong | G06F 3/0412 |

* cited by examiner

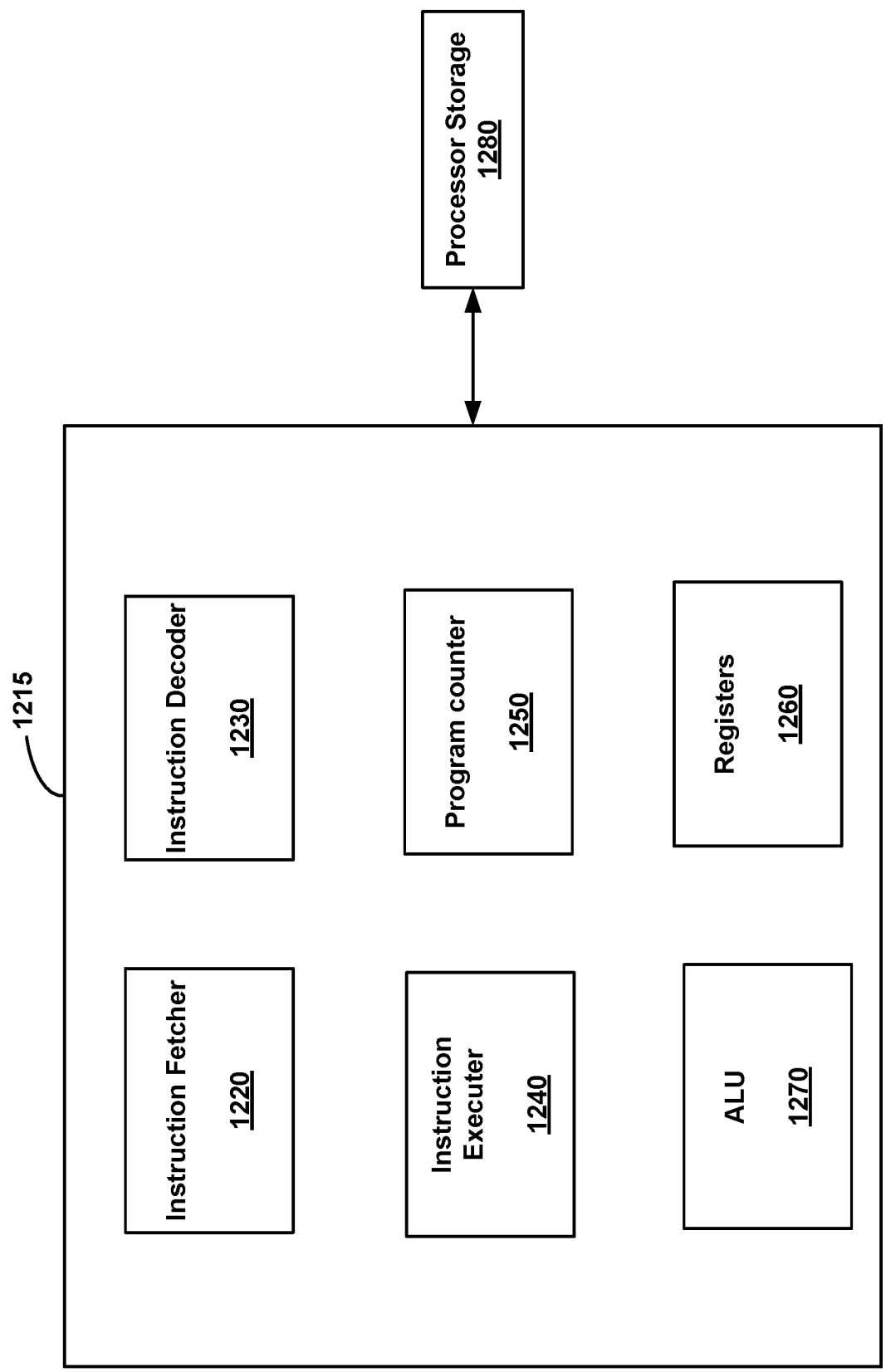

FIG. 14B

SIGNAL REDUCTION IN A MICROCONTROLLER ARCHITECTURE FOR NON-VOLATILE MEMORY

PRIORITY CLAIM

This application claims priority to U.S. Provisional Application No. 62/596,680, entitled "SERIAL-IN AND PARALLEL-OUT PIPELINE SCHEME FOR CORE CONTROL SIGNAL REDUCTION IN NON-VOLATILE MEMORY," filed Dec. 8, 2017, which is herein incorporated by reference in its entirety for all purposes.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 12B is a diagram of one embodiment of a processor that may be used to implement a Core Processor, a Sense Processor, or a Main Processor.

FIG. 14B is a diagram of an embodiment of a conversion relationship between groups of first control signals and fourth signals for first processor and conversion circuit of FIG. 14A.

DETAILED DESCRIPTION

Figure 1:
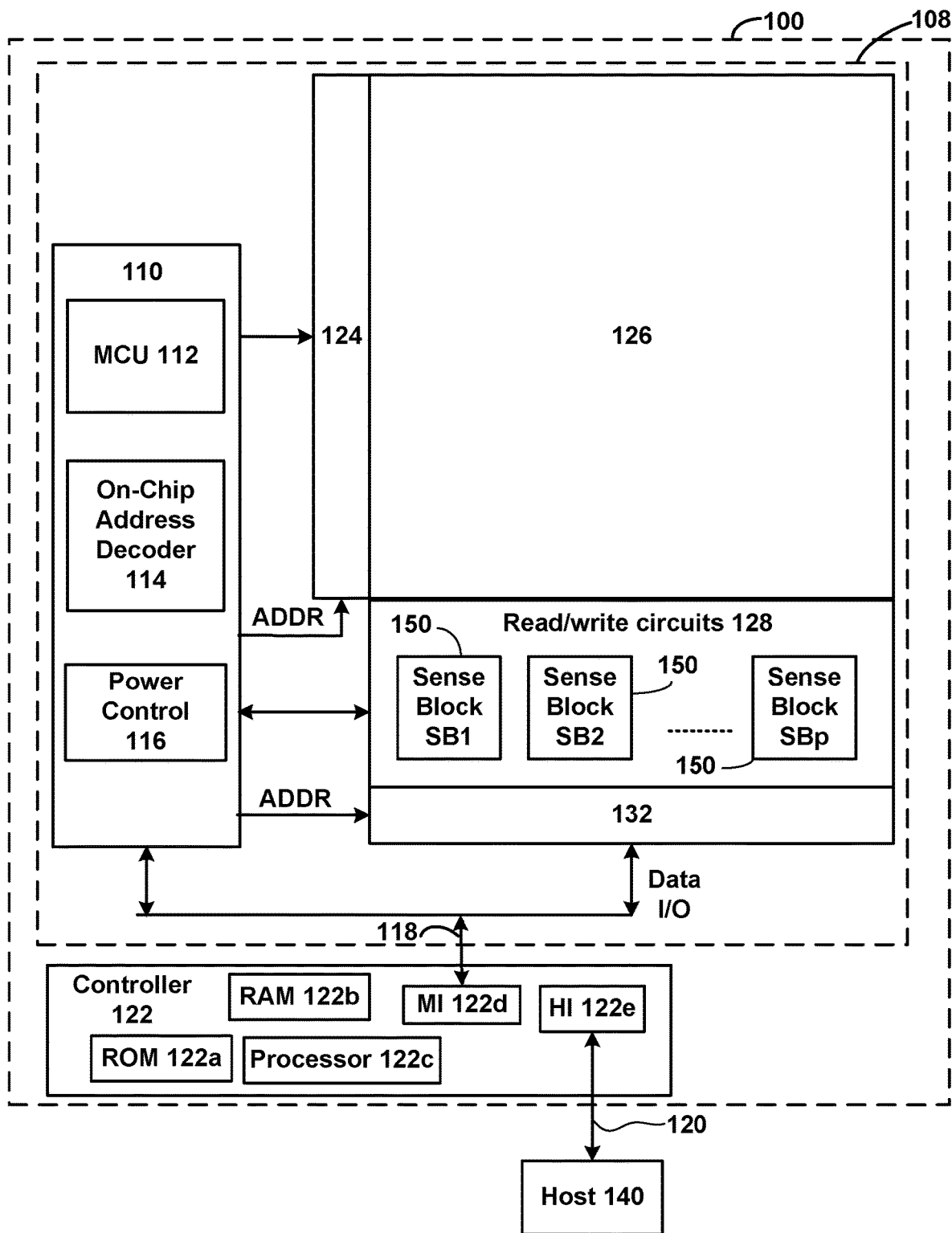
FIG. 1 is a functional block diagram of a memory device.

A proposed non-volatile memory system includes a memory structure and a control circuit connected to the memory structure. The memory structure includes one or more planes of non-volatile memory cells. The control circuit may include a programmable and reprogrammable microcontroller.

One embodiment includes an apparatus including a memory structure, a first processor and a second processor. The first processor is configured to execute first instructions to coordinate sequences of voltages applied to the memory structure by a first circuit to perform memory operations with respect to non-volatile memory cells in the memory structure. The first processor is referred to as a "Core Processor," in one embodiment. The second processor is configured to execute second instructions to control a second circuit to test conditions of the non-volatile memory cells in response to the voltages applied to the memory structure. The second processor is referred to as a "Sense Processor," in one embodiment.

One embodiment includes a conversion circuit coupled via a first number of first physical signal lines to the first processor, and coupled via a second number of second physical signal lines to the first circuit. In an embodiment, the first number of first physical signal lines is less than the second number of second physical signal lines. The conversion circuit reduces a number of first physical signal lines that are coupled between the first processor and the first circuit. In embodiments in which the first processor is located in a first area and the first circuit and the first circuit are located in a second area remote from the first area, reducing a number of first physical signal lines may simplify the task of routing the first physical signal lines between the first processor and the first circuit.

One embodiment of the apparatus includes a third processor that is configured to direct the first processor to execute a first set of the first instructions to coordinate sequences of voltages applied to the memory structure by the first circuit for a particular memory operation. The third processor is configured to direct the second processor to execute a second set of the second instructions to control the second circuit to test a condition of a group of the non-volatile memory cells for the particular memory operation. The third processor is referred to as a "Main Processor," in one embodiment.

Each of the processors has access to storage which contains instructions executed by the processor. The instructions can be modified by replacing the instructions in the storage, which provides great flexibility. Thus, updates and/or design changes can be made with firmware updates rather than hardware or circuit changes. Also, less hardware is needed for testing the architecture, which means the size of the design can be smaller. Thus, design changes are much more flexible compared to, for example, an architecture in which a hard-wired state machine is used instead of the processors.

In an embodiment, the voltage waveforms and timing controlled by the Core Processor are modifiable after tape out without new hardware or circuit designs. Likewise, in an embodiment conditions tested for by the Sense Processor are modifiable without new hardware or circuit designs. Also, in an embodiment the algorithm run by the Main Processor which controls the execution of the memory operation is modifiable without new hardware or circuit designs.

In an embodiment, the processors of the microcontroller may execute in parallel, which is more efficient and reduces overhead. For example, during program or read operations, each of the processors may have different functions. The Core Processor and the Sense Processor may each have their own queues. The Main Processor may place addresses or other identifiers of instructions on the queues in order to control which instructions the Core and Sense Processors execute. Therefore, the Main Processor may act as a master.

Figure 2:
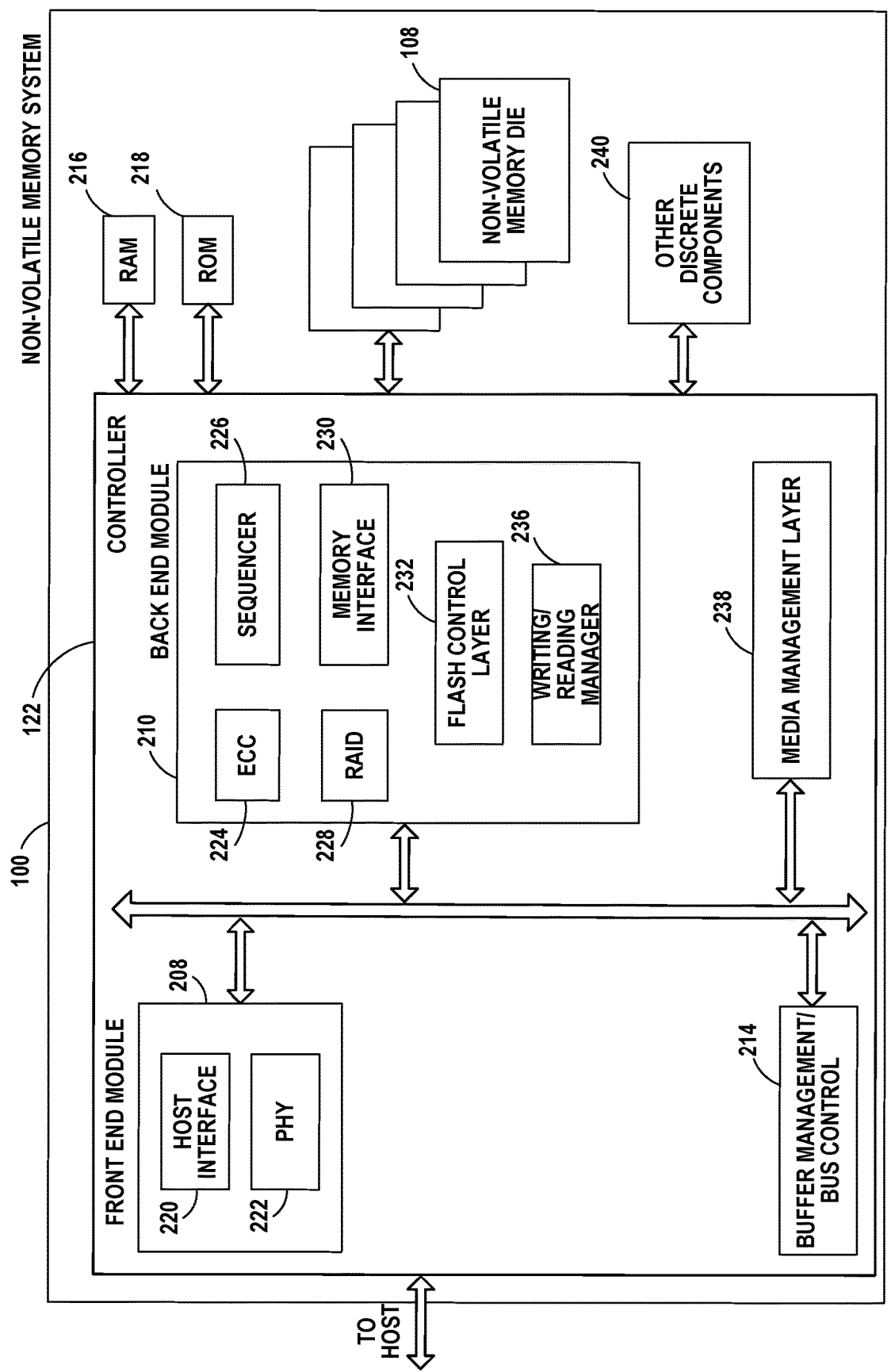
FIG. 2 is a block diagram depicting one embodiment of a memory system.
Figure 3:
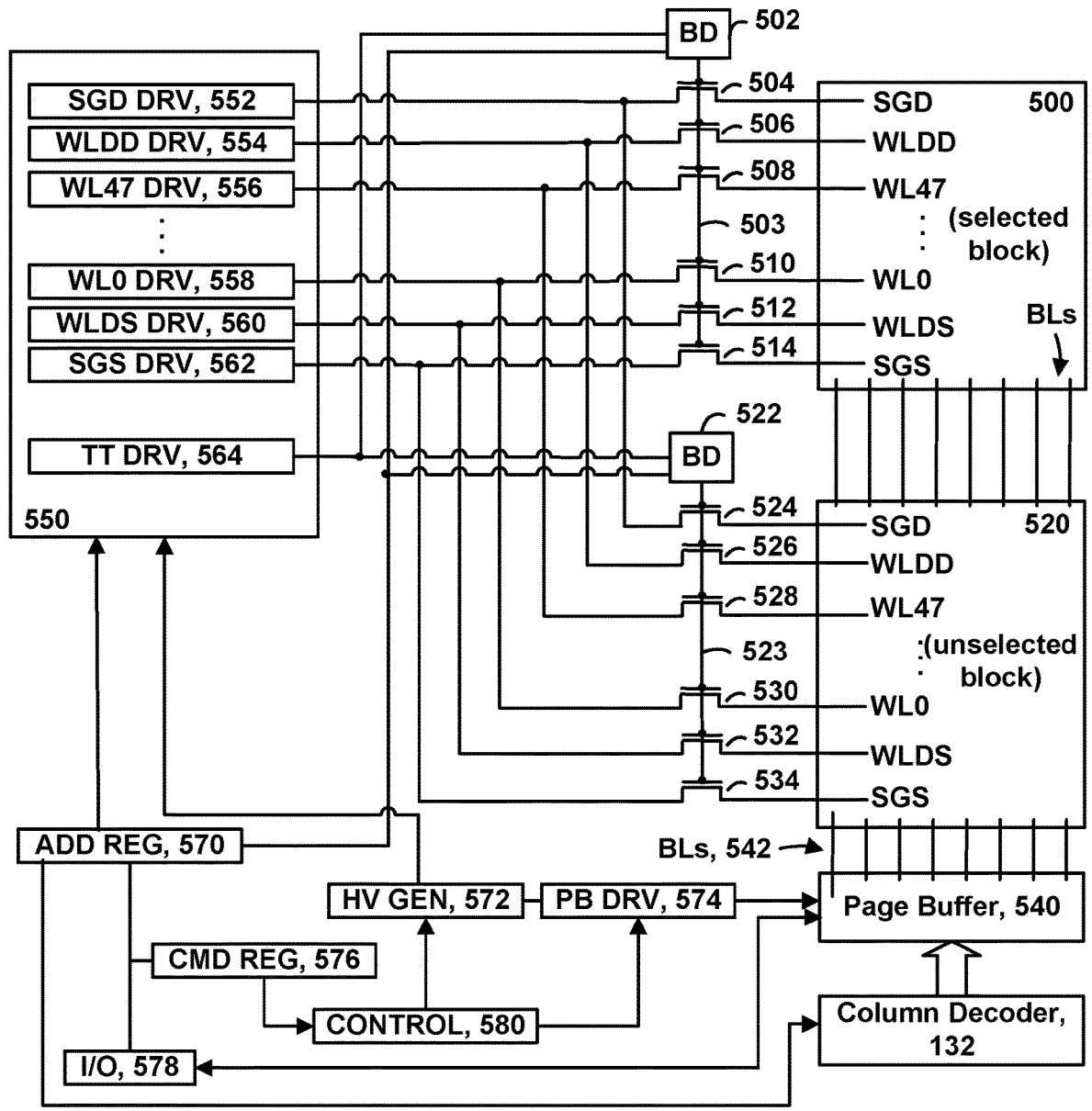
FIG. 3 depicts an embodiment of circuits for applying voltages to a memory structure.

FIGS. 1-3 describe one set of examples of a memory system that can be used to implement the technology described herein. FIG. 1 is a functional block diagram of an example memory system 100. The components depicted in FIG. 2 are electrical circuits. Memory system 100 includes one or more memory die 108. The one or more memory die 108 can be complete memory die or partial memory die.

In one embodiment, each memory die 108 includes a memory structure 126, control circuitry 110, and read/write circuits 128. Memory structure 126 is addressable by word lines via a row decoder 124 and by bit lines via a column decoder 132. Read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, controller 122 can be separated from memory die 108. In some embodiments controller 122 will be on a different die than the memory die 108. In some embodiments, a single controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a programmable and reprogrammable microcontroller (MCU) 112, an on-chip address decoder 114, and a power control circuit 116. Microcontroller 112 provides die-level control of memory operations. In an embodiment, microcontroller 112 is programmable by software. In other embodiments, microcontroller 112 does not use software and is completely implemented in hardware (e.g., electrical circuits). In an embodiment, control circuitry 110 includes buffers such as registers, ROM fuses and other storage devices for storing default values such as base voltages and other parameters.

On-chip address decoder 114 provides an address interface between addresses used by host 140 or controller 122 to the hardware address used by row decoder 124 and column decoder 132. Power control circuit 116 controls the power and voltages supplied to the word lines and bit lines during memory operations. Power control circuit 116 may include charge pumps for creating voltages. Sense blocks 150 include bit line drivers.

Microcontroller 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, Field Programmable Gate Array (FGA), Application Specific Integrated Circuit (ASIC), integrated circuit or other type of circuit.

In an embodiment, control circuitry 110 (including microcontroller 112), read/write circuits 128, decoders 124 and decoders 132 are positioned on the substrate and underneath memory structure 126.

Controller 122 (which in one embodiment is an electrical circuit) may include one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in memory structure 126, such as a reserved area of memory cells connected to one or more word lines. RAM 122b can be to store data for controller 122, including caching program data (discussed below).

Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 via data bus 120 to receive commands, addresses and/or data from host 140 to provide data and/or status to host 140.

In one embodiment, memory structure 126 includes a three dimensional memory array of non-volatile memory cells in which multiple memory levels are formed above a substrate, such as a wafer. Memory structure 126 may include any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 includes a two dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1A:
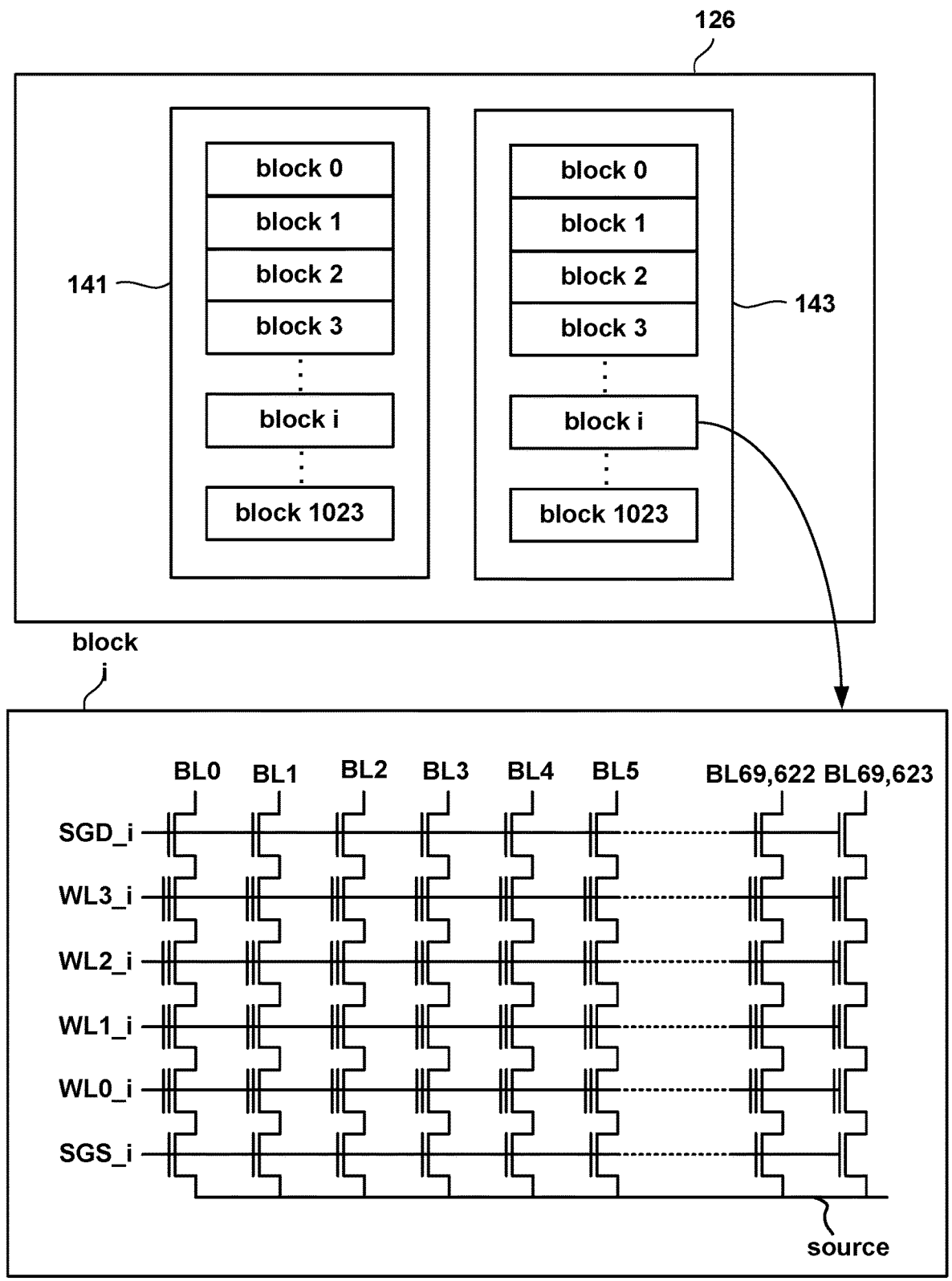
FIG. 1A is a block diagram depicting one example of a memory structure.

FIG. 1A depicts an example of memory structure 126. In one embodiment, an array of memory cells is divided into multiple planes. In the example of FIG. 1A, memory structure 126 is divided into two planes: plane 141 and plane 143. In other embodiments, more or less than two planes can be used. In some embodiments, each plane is divided into a number of memory erase blocks (e.g., blocks 0-1023, or another amount).

In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase also can be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines. For example, erase block i of FIG. 1A includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1A shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1A shows 69624 bit lines, a different number of bit lines also can be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data are being written into the array, and also checks the ECC when data are being read from the array. In one embodiment, a page includes data stored in all memory cells connected to a common word line.

In the example discussed above, the unit of erase is a memory erase block and the unit of programming and reading is a page. Other units of operation also can be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

Figure 1B:
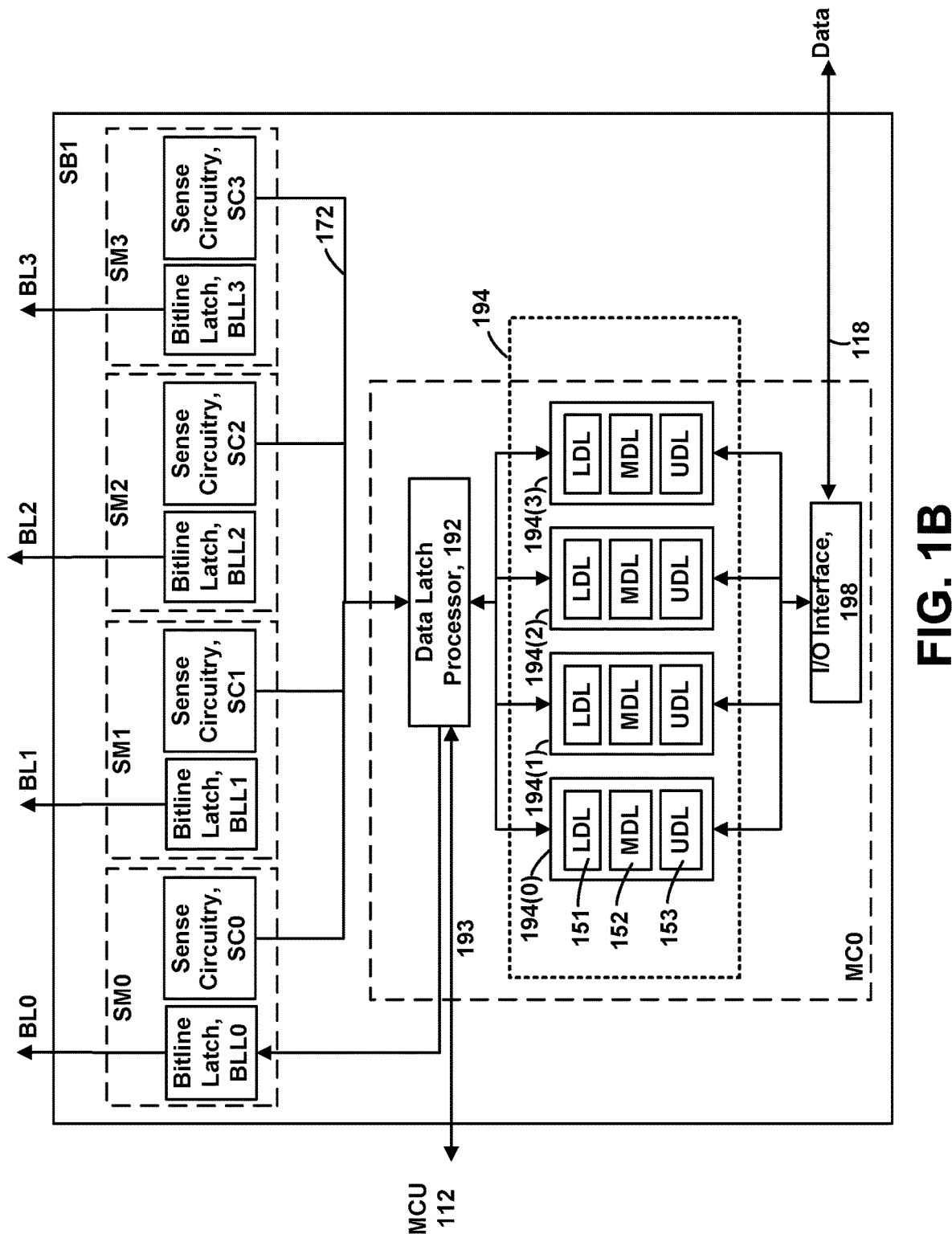
FIG. 1B is a block diagram depicting one embodiment of the sense block SB1 of FIG. 1A.

FIG. 1B is a block diagram depicting one embodiment of the sense block SB1 of FIG. 1. Sense block SB1 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 includes sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 includes a data latch processor 192, four example sets of data latches 194(0), 194(1), 194(2) and 194(3) and an I/O interface 198 coupled between the sets of data latches 194 and lines 118. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3.

Each set of data latches includes data latches identified by LDL 151, MDL 152, and UDL 153, in this embodiment. LDL 151 stores a bit for a lower page of write data, MDL 152 stores a bit for a middle page of write data, and UDL 153 stores a bit for an upper page of write data, in a memory which stores three bits of data in each memory cell. Note that there may be one set of such latches associated with each bit line. The latches 194 also may be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its threshold voltage is within a specified margin of the verify voltage of its target data state.

Data latch processor 192 performs computations during reading and programming. For reading, data latch processor 192 determines the data state stored in the sensed memory cell and stores the data in the set of data latches. For full programming and refresh programming, data latch processor 192 reads the latches to determine the data state which is to be written to a memory cell.

During reading, the operation of the system is under the control of microcontroller 112 which controls the supply of different control gate voltages to the addressed memory cell. As it steps through the various predefined control gate voltages corresponding to the various memory states supported by the memory, the sense module may trip at one of these voltages and a corresponding output will be provided from the sense module to data latch processor 192 via data bus 172. At that point, data latch processor 192 determines the memory state by considering the tripping event(s) of the sense module and the information about the applied control gate voltage from microcontroller 112 via input lines 193.

Data latch processor 192 then computes a binary encoding for the memory state and stores the resultant data bits into the data latches 194. For example, the memory state for a memory cell associated with bit line BL0 may be stored in latches 194(0), etc. Herein, a "memory state" may also be referred to as a "data state." In another embodiment of the managing circuit MC0, the bit line latch serves both as a latch for latching the output of the sense module and also as a bit line latch as described above.

In an embodiment, MCU 112 executes instructions to control data latch processor 192 to test conditions of non-volatile memory cells in response to voltages applied to memory structure 126 (such as reference voltages applied to the non-volatile memory cells). The condition of a non-volatile memory cell can be any physical parameter of a non-volatile memory cell. Example conditions include, but are not limited to, a data state (e.g., S0-S7 in FIG. 4), a conduction current, a resistance, and a transistor threshold voltage. The manner in which the condition may be tested may include, but is not limited to, sensing, reading, detecting, measuring, probing, discovering, discriminating, checking, examining, and determining.

In an embodiment, MCU 112 executes instructions to control data latch processor 192 to determine a data state (e.g., S0-S7 in FIG. 4) of memory cells. The data state may be defined by a range of some physical parameter including, but not limited to, transistor threshold voltage, resistance, or current. Thus, to determine a data state means to determine what range of a certain physical parameter a memory cell is in.

In an embodiment, MCU 112 executes instructions to control data latch processor 192 to determine whether a memory cell conducts a current in response to voltages applied to the memory cell. In an embodiment, MCU 112 executes instructions to control data latch processor 192 to determine whether the threshold voltage of a memory cell is above or below a reference voltage (e.g., Vr1-Vr7; or Vv1-Vv7 in FIG. 4) applied to the memory cell.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because microcontroller 112 receiving the wired-OR can determine when all bits being programmed have reached the desired level.

For example, when each bit has reached its desired level, a logic zero for that bit will be sent to the wired-OR line (or a data one is inverted). When all bits output a data 0 (or a data one inverted), then microcontroller 112 knows to terminate the programming process. Because each processor communicates with four sense modules, microcontroller 112 needs to read the wired-OR line four times, or logic is added to data latch processor 192 to accumulate the results of the associated bit lines such that microcontroller 112 need only read the wired-OR line one time. Similarly, by choosing the logic levels correctly, microcontroller 112 can detect when the first bit changes its state and change the algorithms accordingly.

During program or verify operations, the data to be programmed (write data) are stored in data latches 194 from lines 118, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of microcontroller 112, comprises a series of programming voltage pulses applied to the control gates of the addressed memory cells. Each programming voltage is followed by a read back (verify test) to determine if the memory cell has been programmed to the desired memory state.

In some cases, data latch processor 192 monitors the read back memory state relative to the desired memory state. When the two states agree, data latch processor 192 sets the bit line latch to cause the bit line to be pulled to a state designating program inhibit (e.g., 2-3V). This inhibits the memory cell coupled to the bit line from further programming even if programming voltages appear on its control gate. In other embodiments, data latch processor 192 initially loads the bit line latch, and the sense circuitry sets the bit line latch to an inhibit value during the verify process.

Each set of data latches 194 may be implemented as a stack of data latches for each sense module. In some implementations, the data latches are implemented as a shift register so that the parallel data stored therein is converted to serial data for lines 118, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 122. In an embodiment, controller 122 is a flash memory controller. Non-volatile memory 108 is not limited to flash memory technology. Thus, controller 122 is not limited to the example of a flash memory controller. As used herein, a flash memory controller is a device that manages data stored in flash memory and communicates with a host, such as a computer or electronic device. A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when a host needs to read data from or write data to the flash memory, the host will communicate with the flash memory controller. If the host provides a logical address to which data are to be read/written, the flash memory controller can convert the logical address received from the host to a physical address in the flash memory. (Alternatively, the host can provide the physical address). The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example.

For example, each module may include an ASIC, an FPGA, a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e., RAM, ROM, processor, interface).

Referring again to modules of controller 122, a buffer management/bus control 214 manages buffers in random access memory (RAM) 216 and controls the internal bus arbitration of controller 122. A read only memory (ROM) 218 stores system boot code. Although illustrated in FIG. 2 as located separately from controller 122, in other embodiments one or both of the RAM 216 and ROM 218 may be located within controller 122. In yet other embodiments, portions of RAM and ROM may be located both within controller 122 and outside controller 122. Further, in some implementations, controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. Host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one more extra die as implied by the common name, but RAID parity also may be added within the existing die, e.g., as an extra plane, or extra block, or extra WLs within a block.

A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flow charts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of physical layer interface 222, RAID module 228, media management layer 238 and buffer management/bus controller 214 are optional components that are not necessary in controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, MML 238 may include an algorithm in the memory device firmware which translates writes from the host into writes to memory structure 126 of die 108. MML 238 may be needed because memory structure 126: 1) may have limited endurance; 2) may only be written in multiples of pages; and/or 3) may not be written unless it is erased as a block.

MML 238 understands these potential limitations of memory structure 126 which may not be visible to the host. Accordingly, MML 238 attempts to translate writes from host into writes into memory structure 126. As described below, erratic bits may be identified and recorded using MML 238. This recording of erratic bits can be used for evaluating the health of blocks and/or word lines (the memory cells on the word lines).

Controller 122 may interface with one or more memory die 108. In one embodiment, controller 122 and multiple memory die (together comprising non-volatile storage system 100) implement an SSD, which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a diagram that shows further details of one embodiment of circuits for applying voltages to a memory structure 126. Two blocks 500, 520 of memory cells are depicted. Circuits of FIG. 3 apply voltages to word lines and select lines. Microcontroller 112 provides control signals to the circuits, in one embodiment. For example, microcontroller 112 may issue control signals to one or more of CONTROL 580, High Voltage Generator (HV GEN) 572, Page Buffer Driver (PB DRV) 574, Command Register (CMD REG) 576 and Input/Output (I/O) Buffer 578. In an embodiment, microcontroller 112 issues control signals to CONTROL 580, which in turn controls other elements such as HV GEN 572 and PB DRV 574.

IN an embodiment, HV GEN 572 is connected to word line driver 550, to control magnitudes and timing of voltages. PB DRV 574 is connected to page buffer 540 to control the page buffer 540. The page buffer 540 may include sense blocks, such as SB1 of FIG. 1B.

Each block of storage elements is associated with a set of transfer transistors, in one possible embodiment. For example, block 500, which is a selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL30-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514.

The control gate of each transfer transistor of block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, BD 502 acts as a conductive switch which passes the voltage to the control gates of the associated transfer transistors via path 503. If the address does not match the address of BD 502, BD 502 acts as a non-conductive switch which does not pass the voltage to the control gates of the associated transfer transistors.

Each transfer transistor may be an n-channel MOSFET, for example, which has a drain node on the left hand side and a source node on the right hand side. The drain node for each transfer transistor is connected to a respective voltage driver in a set of high-voltage voltage drivers 550. Each driver may include an on-chip charge pump.

For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, . . . , a transfer transistor 530 connected to WL0 and WL0 DRV 558, a transfer transistor 532 connected to WLDS and WLDS DRV 560, and a transfer transistor 534 connected to SGS and SGS DRV 562.

The control gates of the transfer transistors of unselected block 520 are connected to a respective block decoder (BD) 522 via a common path 523. BD 522 also is connected to TT DRV 564 to receive a voltage, and to address register 570 to receive a control signal which instructs BD 522 to pass or not pass the voltage to the control gates of the associated transfer transistors via path 523. Address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to column decoder 132. Page buffer 540 stores data which are written into, or read from, a selected word line of the selected block.

During an operation of the memory device, address register 570 provides a data load command to an input-output buffer 578 and to a command register 576. Input-output buffer 578 provides the command to page buffer 540. Command register 576 provides a command to a control circuit 580, which instructs a high voltage generator 572 to control voltage drivers 550 at appropriate levels.

Typically, during programming, the driver of the selected word line provides a programming level voltage, such as 12-26 V and the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. Control 580 also instructs the page buffer driver (PB DRV) 574 to control page buffer 540. Address register 570 also communicates with column decoder 132.

Figure 4:
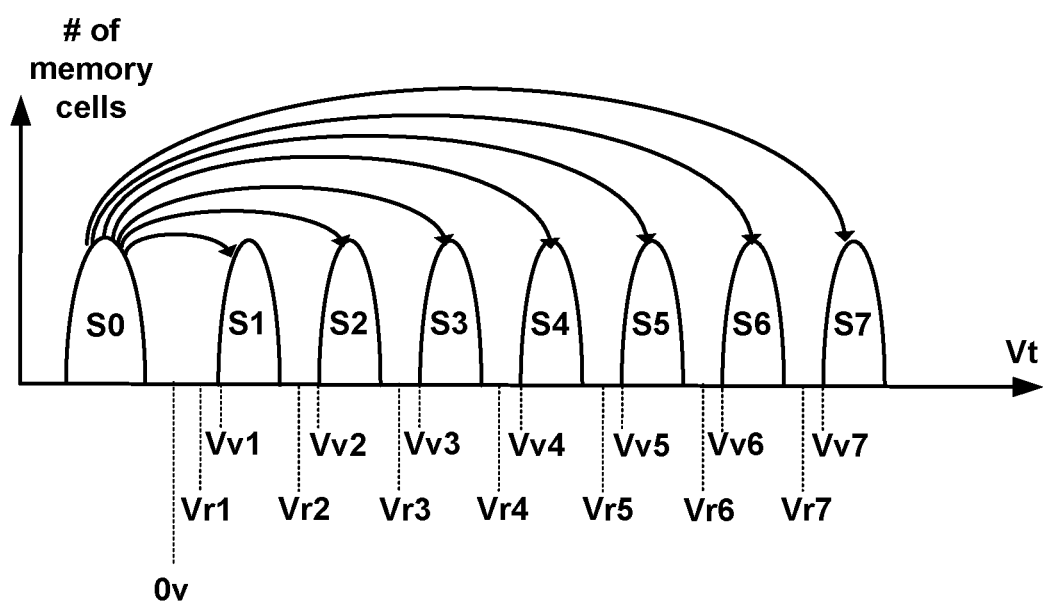
FIG. 4 depicts threshold voltage distributions.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell).

FIG. 4 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, also are called programmed states. Each threshold voltage distribution (data state) corresponds to predetermined values for the set of data bits.

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (e.g., S0, S1, S2, S3, . . . ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

In one embodiment, when a block is subjected to an erase operation, all memory cells are moved to data state S0, the erased state. The proposed technology described herein can be used for embodiments in which each memory cell stores one bit of data per memory cell (also referred to as SLC) and for embodiments in which each memory cell stores multiple bits of data per memory cell (FIG. 4). When memory cells store one bit of data per memory cell, there may be two data states. When memory cells store two bits of data per memory cell, there may be four data states.

Figure 5:
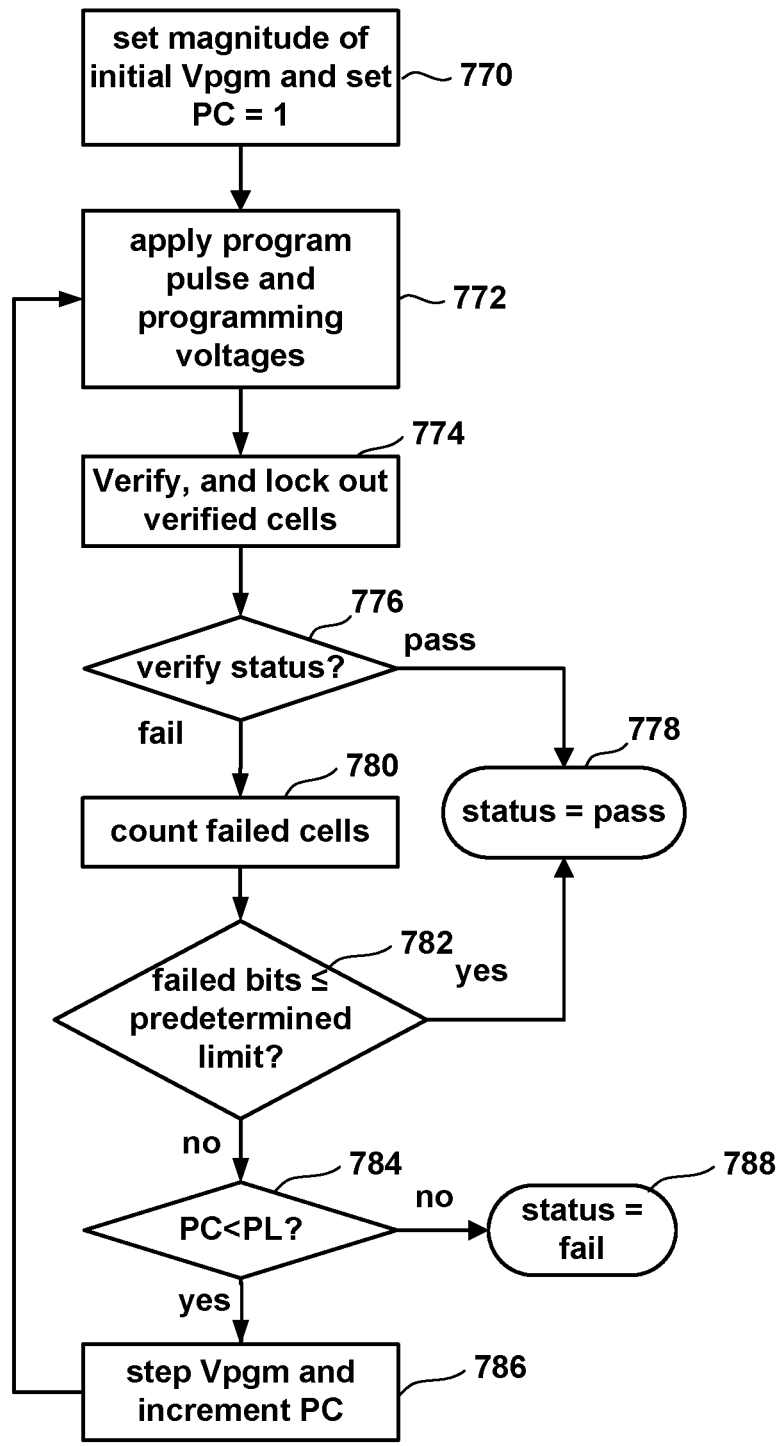
FIG. 5 is a flow chart describing one embodiment of a process for programming/writing data into memory cells connected to a common word line.

FIG. 5 is a flowchart describing one embodiment of a process for programming. In one example embodiment, the process of FIG. 5 is performed on memory die 108 using the one or more control circuits discussed above (see FIG. 1), at the direction of microcontroller 112. The process of FIG. 5 also can be used to implement the full sequence programming discussed above. The process of FIG. 5 also can be used to implement each phase of a multi-phase programming process. Additionally, the process of FIG. 5 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 5, the programming voltage (Vpgm) is initialized to the starting magnitude (e.g., ~12-16V or another suitable level) and a program counter PC maintained by microcontroller 112 is initialized at 1.

In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target data states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by microcontroller 112, controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault.

If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g., see verify reference voltages Vv1, Vv2, Vv3, Vv4, Vv5, Vv6, and Vv7 of FIG. 4) to determine whether a threshold voltage of the concerned memory cell has reached such level. After applying the word line voltage, the conduction current of the memory cell is measured to determine whether the memory cell turned on (conducted current) in response to the voltage applied to the word line.

If the conduction current is measured to be greater than a certain value, then it is assumed that the memory cell turned ON and the voltage applied to the word line is greater than the threshold voltage of the memory cell. If the conduction current is not measured to be greater than the certain value, then it is assumed that the memory cell did not turn ON and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Step 772 of FIG. 5 includes applying a program voltage pulse on the selected word line. Step 774 of FIG. 5 includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied.

Figure 6:
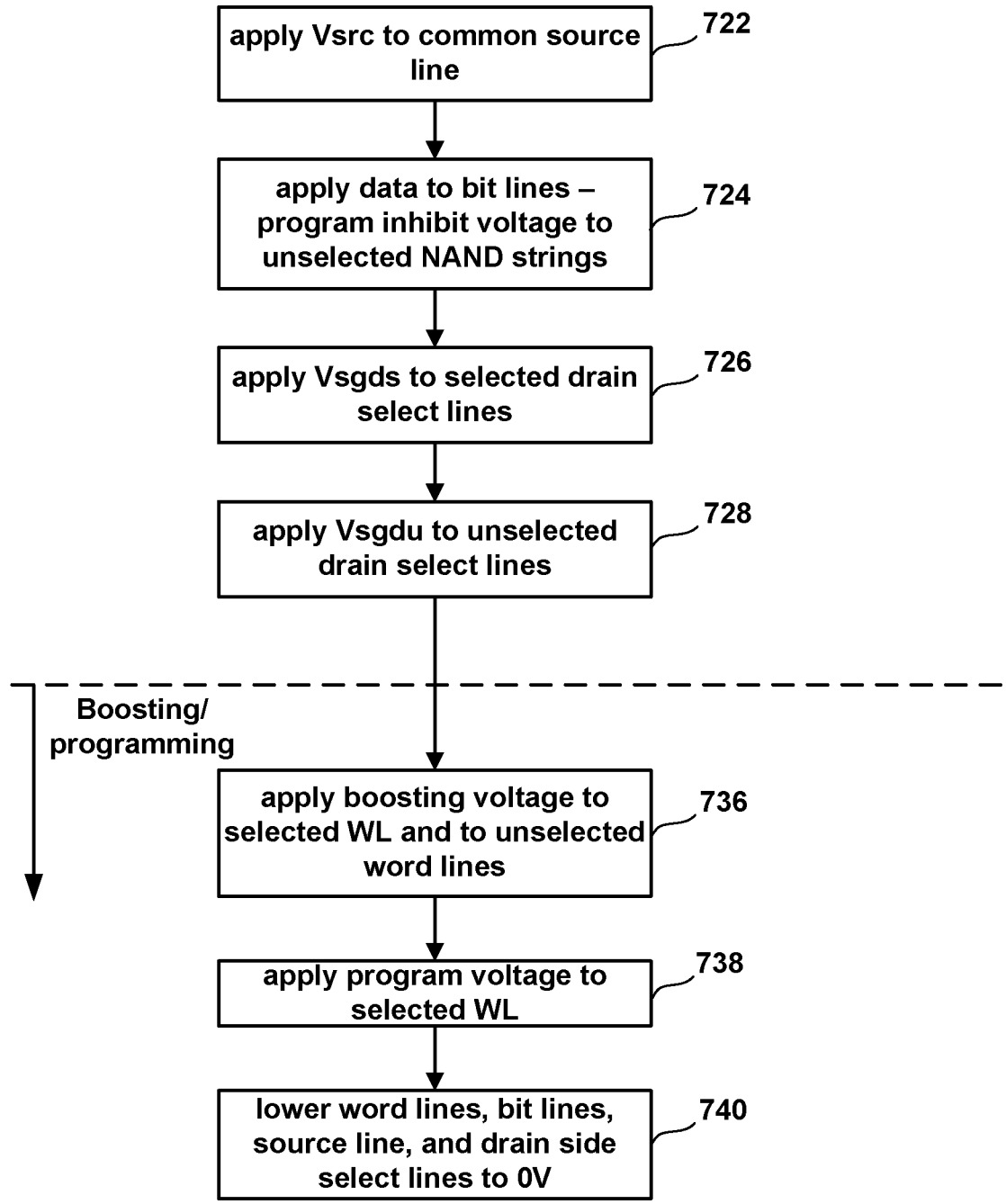
FIG. 6 is a flowchart of one embodiment details of programming non-volatile storage during step 772 of FIG. 5.
Figure 7:
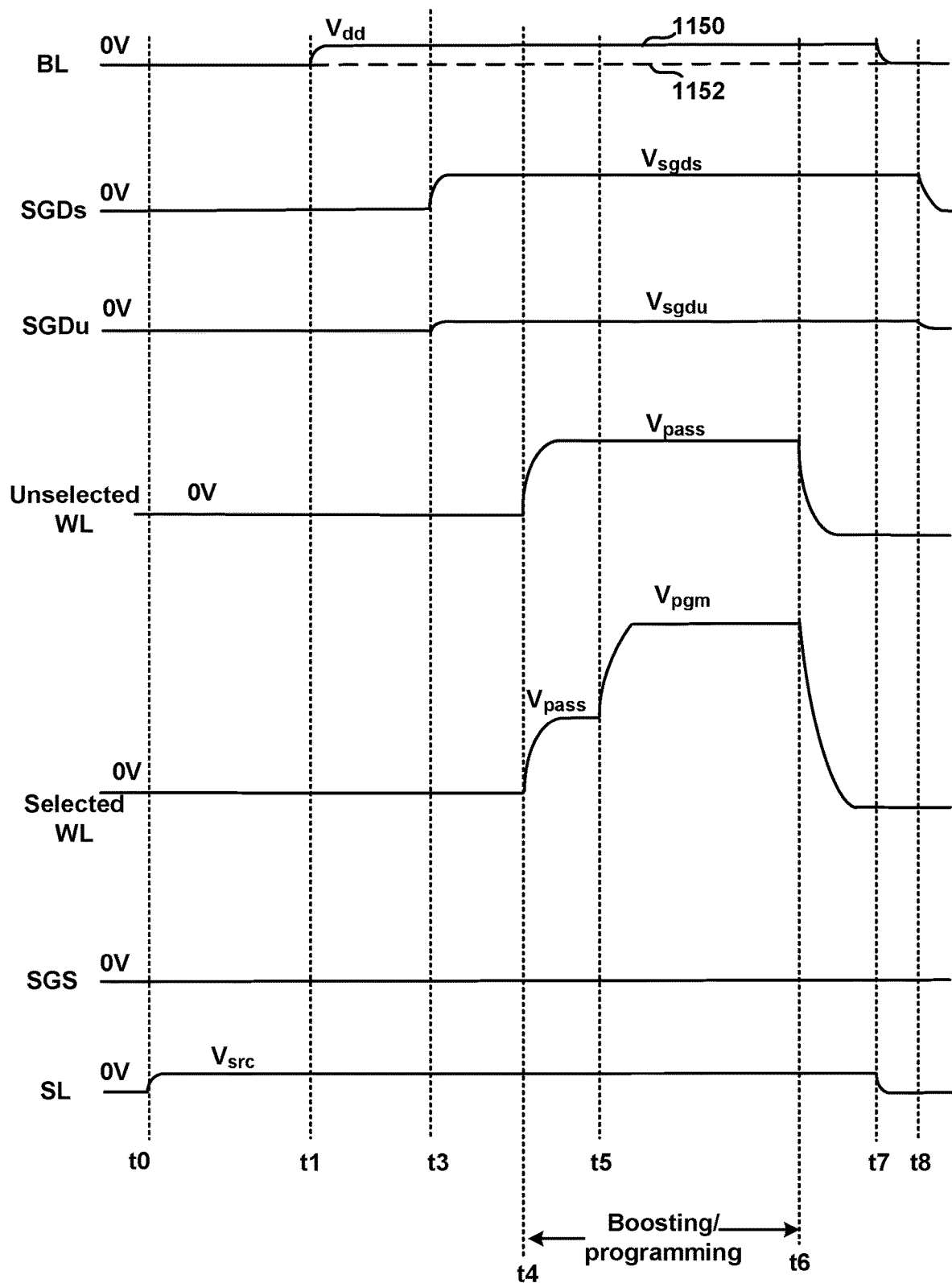
FIG. 7 shows timing of various signals during one embodiment of the process of FIG. 6.

FIG. 6 is a flowchart of one embodiment of applying a program pulse and programming voltages that may be used in step 772 of FIG. 5. This process is used to program 3D NAND in one embodiment. FIG. 7 shows timing of various signals during one embodiment of the process of FIG. 6. Microcontroller 112 controls the timing and magnitudes of the signals in FIG. 7, in one embodiment. Note that the various signals in FIG. 7 are just one example of voltages applied to memory structure 126 during a memory operation. The timing of the signals in FIG. 7 is one example of a "core timing chart" or "CTC."

Referring to FIG. 6, at step 722 a low voltage is applied to the source line. Referring to FIG. 7, at time t0 the common source line SL is raised to a low voltage Vsrc (e.g., about 1.0V-1.5V), where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 7 are at 0V at time t0.

Referring to FIG. 6, at step 724 data are applied to the bit lines. Data may be applied to the bit lines based on whether a memory cell in a NAND string that in the present programming operation is to be programmed. If the memory cell is to be programmed, then its associated bit line has a program enable voltage (e.g., Vb1_Program_Enable) applied to it. If the memory cell is not to be programmed, then its associated bit line has a program inhibit voltage (e.g., Vb1_Inhibit) applied to it.

Referring again to FIG. 7, at time t1 bit lines BL are raised to Vbl_Program_Enable or Vbl_Inhibit. Line 1150 (one example of Vbl_Inhibit) shows the bit line voltage at VDD for a NAND string (in the set that are a part of the present programming operation) having a cell at WLn that is to be inhibited from programming. VDD designates program inhibit and is often referred to as a program inhibit voltage. Line 1152 (one example of V_Program_Enable) shows the bit line voltage at 0V for a NAND string (in the set that are a part of the present programming operation) having a memory cell at the selected word line WLn that is to be programmed.

Referring again to FIG. 6, at step 726 Vsgds is applied to selected drain side select lines. At step 728, Vsgdu is applied to unselected drain side select lines. Note that FIG. 7 shows two SGD lines. Line SGDs refers to a drain side select line having at least one NAND string that is currently programming. Line SGDu refers to a drain side select line having no NAND strings currently programming.

Referring to FIG. 7, at time t3, drain side select line SGDs is raised to Vsgds, and drain side select line SGDu is raised to Vsgdu. The voltage Vsgds turns ON the drain side select transistor for NAND strings having a memory cell being programmed. Note that Vbl_Program_Enable is being applied to the selected bit line BL0 at time t3.

Note that at this time Vsgds also may be applied to control gates of drain side select transistors of NAND strings for which no memory cell should be programmed. However, note that Vbl_Inhibit is being applied to the unselected bit line BL1 at time t3.

At time t3, drain side select line SGDu is set to Vsgdu. The voltage Vsgdu should keep off the associated drain side select transistor.

Referring to FIG. 7, at step 736 a boosting voltage (e.g., $V_{PASS}$) is applied to unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring again to FIG. 7, at time t4 the boosting/programming phase begins. The boosting voltages are applied to the various word lines at time t4. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage typically is less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

Referring again to FIG. 6, at step 738 the program voltage VPGM is then applied to the selected word line. With the boosting voltages applied and the inhibited NAND string channels boosted, program disturb of unselected memory cells on the selected word line is prevented or reduced.

Referring again to FIG. 7, at time t5 the program voltage VPGM is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

Referring again to FIG. 6, at step 740 the word lines, bit lines, source lines, and drain select lines are lowered to 0V, marking the completion of one programming iteration. The steps of FIG. 6 can be applied with each iteration of the process of FIG. 5, with the program voltage being increased each iteration. However, it is not required that the program voltage increase in magnitude with each iteration.

Referring again to FIG. 7, at time t6 the word lines are lowered to 0V. The source and bit lines are then lowered to 0V at time t7. The drain select line SGD is lowered to 0V at time t8.

Numerous variations to the signals depicted in FIG. 7 can be made in accordance with embodiments. Also note that timing and/or magnitudes of the signals in FIG. 7 (as well as other CTCs) can be modified by modifying instructions executed by microcontroller 112. For example, if it is determined that the length of time for which the programming voltage is applied should be changed, then the instructions can be modified to change the length of time between t5 and t6 in the CTC of FIG. 7. Many other modifications to CTCs can be made by modifying instructions executed by the microcontroller 112 and/or by modifying data that microcontroller 112 uses to execute the instructions.

Figure 8:
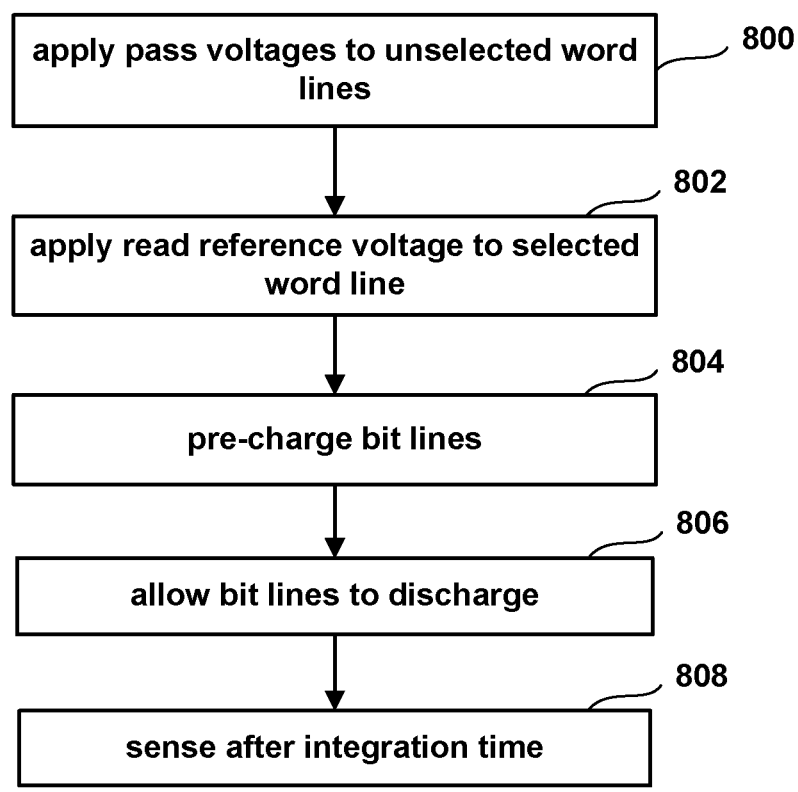
FIG. 8 is a flow chart describing one embodiment of a process for reading data from non-volatile memory cells.

FIG. 8 is a flow chart describing a sensing operation performed to read data from the memory cells. In step 800, a pass voltage is applied to unselected word lines so that unselected memory cells on a NAND string are conducting, which enables the system to test whether a selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0V, or a small voltage near 0V.

In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 808. If the memory cell conducts in response to Vcgr, then the threshold voltage of the memory cell is less than Vcgr. If Vcgr=0V and the memory cell turns ON, then the memory cell is in the erased state and the data stored is 1. If Vcgr=0V and the memory cell does not turn ON, then the memory cell is in the programmed state and the data stored is 0.

Figure 9:
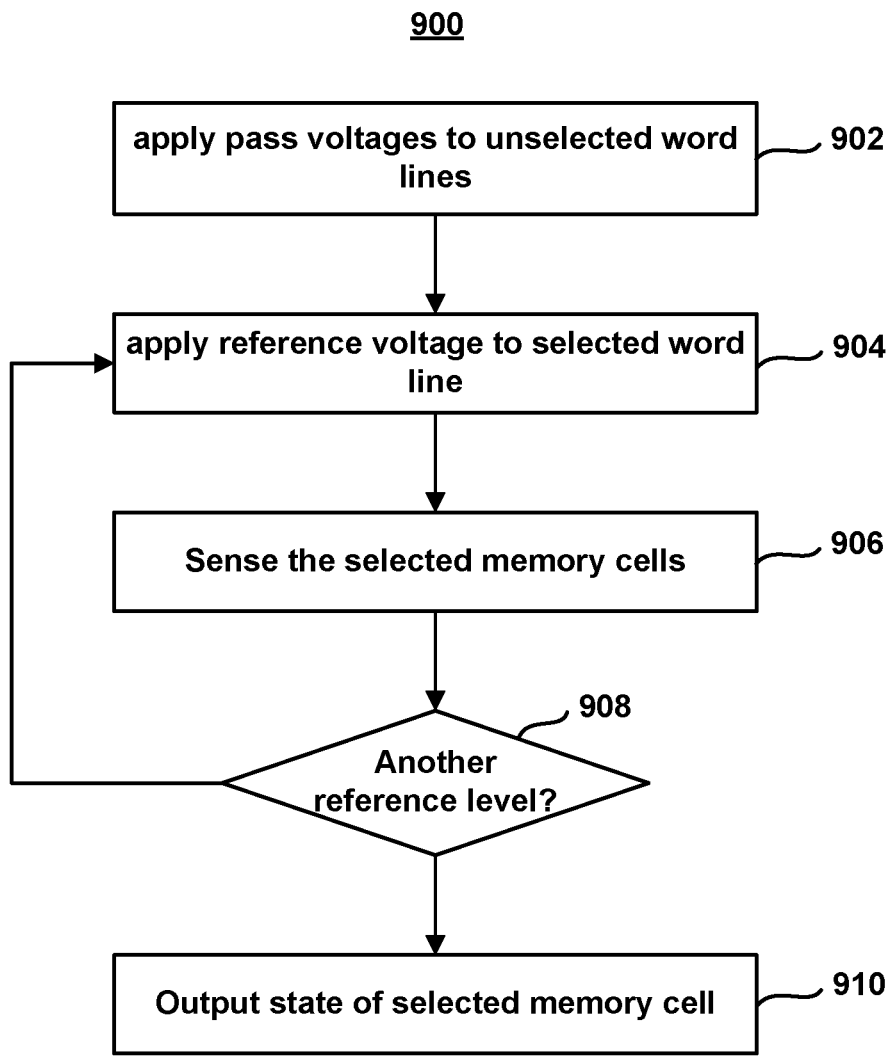
FIG. 9 is a flowchart of an embodiment of process 900 for sensing memory cells.

FIG. 9 is a flowchart of an embodiment of process 900 for sensing memory cells. Process 900 may be used for reading or program verify. Process 900 senses at multiple reference levels. For a read operation, the process progressively steps through levels Vr1-Vr7 (see FIG. 4), in one embodiment. For a program verify operation, the process progressively steps through levels Vv1-Vv7 (see FIG. 4), in one embodiment.

Step 902 includes applying pass voltages to unselected word lines. Step 904 includes applying a reference voltage to the selected word line. This might be Vr1 or Vv1, for example.

Step 906 includes sensing the selected memory cells. In one embodiment, the sense module (e.g., SM0, SM1, . . . ) connected to the bit line for one of the selected memory cells may trip in response to the reference voltage applied to the selected word line. A corresponding output will be provided from the sense module to data latch processor 192 via data bus 172. Based on the reference level when the sense module trips, data latch processor 192 may determine the data state (e.g., S0-S7) of the selected memory cell. Note that steps 904-906 may be referred to herein as a "sensing phase."

Step 908 is a determination of whether there is another reference level to apply to the selected word line. If so, process 900 returns to step 904 to apply the next reference level. Step 906 is then performed again to test the selected memory cells.

After all reference levels have been applied to the selected word line, step 910 is performed. In step 910, data latch processor 192 outputs the data state (e.g., S0-S9) of each of the selected memory cells.

As described above, in one embodiment a page is the unit of operation for programming (writing) and reading. In one example, a page is all the data stored in all memory cells connected to a common word line. In other embodiments, a page can be one bit of data from each memory cell connected to a common word line. In other embodiments, pages can include other aggregations of data. In one example, a page of data is 16 KB. In some embodiments, the system requires all writing and reading to be by the page. In other embodiments, the system allows partial pages to be written to and read. Example of a partial page can be 2 KB or 4 KB. Other subsets of a page can also be used as a partial page.

Previous state machine designs require tape-out or engineering change orders for each design change of new feature. This slows down the development process. Therefore, it is proposed to use a programmable and reprogrammable microcontroller (e.g., microcontroller 112 of FIG. 1) in place of the previously used state machine. Features can be added and functionality can be changed by updating software (including firmware) for microcontroller 112.

Microcontroller 112 provides on-die control for reading, programming, and erasing the non-volatile memory cells of memory structure 126. Additionally, microcontroller 112 provides on-die control for interfacing with controller 122.

Figure 10A:
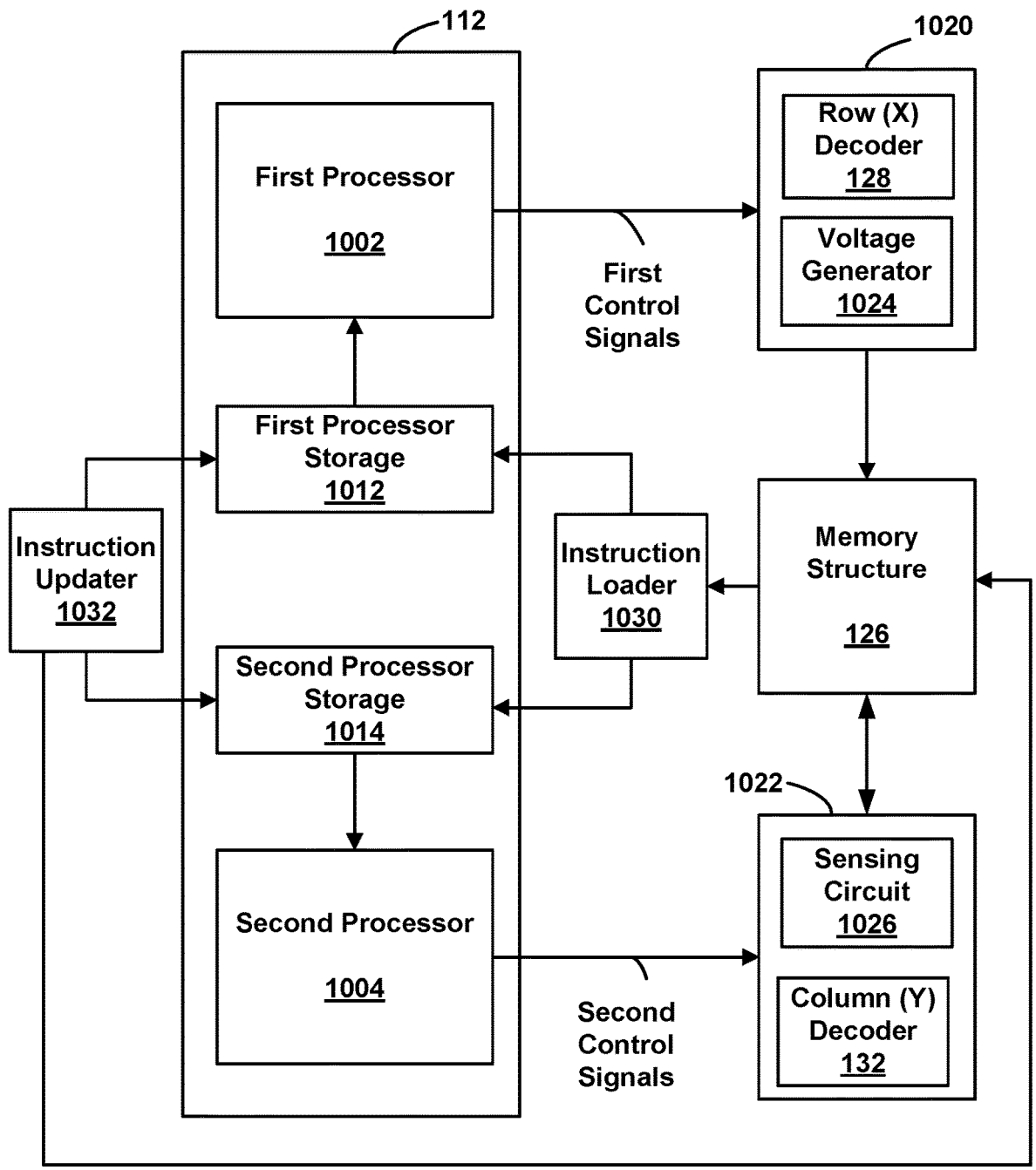
FIG. 10A is a high-level block diagram of one embodiment of a microcontroller, having two processors, and other elements.

FIG. 10A is a high-level block diagram of one embodiment of microcontroller 112, and other elements. The other elements include a memory structure 126, which contains non-volatile memory cells, a first circuit 1020, and a second circuit 1022. In an embodiment, first circuit 1020 includes a voltage generator 1024 and row decoder 124. In an embodiment, first circuit 1020 is configured to apply voltages to memory structure 126. This may include voltages to one or more of word lines, select lines (e.g., SGD, SGS), source lines, and other elements in memory structure 126. First circuit 1020 may include decoders (e.g., row decoder 124) and charge pumps, which provide the voltages for word lines, select lines (e.g., SGD, SGS), source lines, and other elements in memory structure 126. First circuit 1020 may include power control circuit 116 and/or on-chip address decoder 114 (FIG. 1).

In one embodiment, first circuit 1020 includes one or more of the elements in FIG. 3 that are connected to blocks 500, 520. For example, voltage generator 1024 may include high-voltage voltage drivers 550 (each driver may include an on-chip charge pump). Row decoder 124 may include one or more of block decoder (BD) 522, transfer transistors 504-514, 524-534. First circuit 1020 may include other elements from FIG. 3, such as CONTROL 580, HV GEN 572, PB DRV 574, CMD REG 576, and/or ADD REG 570. First circuit 1020 is not limited to the embodiment depicted in FIGS. 10A and 3, and may include additional/fewer circuit elements than the ones described above.

Second circuit 1022 is configured to test conditions of the non-volatile memory cells in response to the voltages applied to memory structure 126. Second circuit 1022 includes sensing circuit 1026 and column decoders 132. Sensing circuit 1026 may include and control sense amplifiers that sense a current of a memory cell.

In one embodiment, sensing circuit 1026 includes all or a portion of a sense block (see, for example, SB1 in FIG. 1B). For example, sensing circuit 1026 may include sense modules (e.g., SM0, SM1, SM2, SM3) and data latches (e.g., latches 194). In an embodiment, sensing circuit 1026 includes data latch processor 192 (see FIG. 1B). In an embodiment, data latch processor 192 tests conditions of the non-volatile memory cells in response to the voltages applied to memory structure 126.

Second circuit 1022 may include one or more managing circuits (e.g., MC0, FIG. 1B). Sensing circuit 1026 need not include all elements in the MC0 depicted in FIG. 1B. Also, sensing circuit 1026 may include elements not depicted in MC0 of FIG. 1B. In one embodiment, second circuit 1022 includes page buffer 540, PB DRV 574, and I/O Buffer 578 (see FIG. 3). Note that CONTROL 580 may be shared between first circuit 1020 and second circuit 1022.

Microcontroller 112 includes a first processor 1002 and a second processor 1004. First processor 1002 provides first control signals (also referred to herein as "Core Control Signals") (such as the signals depicted in FIG. 7) to first circuit 1020. Core Control Signals may be analog or digital signals. Core Control Signals may be sent over a communication medium that may include one or more signal lines that are capable of transmitting an electrical signal, such as a voltage level, in some embodiments.

For example, a signal line may be an electrically conductive path. A signal line is capable of transmitting an electromagnetic signal, such as an optical signal (e.g., light pulse), in some embodiments. For example, a signal line may comprise an optical waveguide. In embodiments, a signal line may include, but is not limited to, one or more of a wire, trace, transmission line, track, pad, layer, lead, metal, portion of a printed circuit board or assembly, conducting material and other material that may transfer or carry an electrical signal, and/or electromagnetic signal.

In embodiments, a signal line may form one or more geometric shapes, such as a line or multiple connected lines. In embodiments, a signal line may be unidirectional or bidirectional in transferring signals between circuits and within circuits. Note that the communication medium may include elements other than the signal lines, such as drivers, buffers, or logic gates.

In an embodiment, first processor 1002 is configured to provide Core Control Signals to first circuit 1020 to control analog voltages (e.g., word line voltages, select line voltages, etc.) applied by first circuit 1020 to memory structure 126. In an embodiment, first processor 1002 is configured to provide Core Control Signals to first circuit 1020 to control decoders and charge pumps in first circuit 1020. In an embodiment, first processor 1002 is configured to provide Core Control Signals to first circuit 1020 to control voltage levels applied by sense modules (e.g., sense modules SM0, SM1, SM2 and SM3 in FIG. 1B). Note that throughout this description, the phrase, "a processor is configured to control a circuit" or the like, does not require that the processor control all functionality of the circuit.

Note that the timing of the sequences of voltages applied by first circuit 1020 to program, read, or erase memory cells may be very complex. In some embodiments, a CTC specifies the timing of the sequences of voltages. FIG. 7 illustrates an example CTC showing the timing of the sequences of voltages applied during a programming operation. In an embodiment, first processor 1002 is configured to implement the CTC for different memory operations. In an embodiment, first processor 1002 may be configured to execute first instructions (e.g., stored in first processor storage 1012) to provide Core Control Signals to first circuit 1020 to coordinate sequences of voltages applied to memory structure 126 by first circuit 1020 to perform memory operations with respect to non-volatile memory cells in memory structure 126. The memory operations may be, for example, read, program, and/or erase operations.

Second processor 1004 sends second control signals (also referred to herein as "Sense Control Signals") to second circuit 1022. Sense Control Signals may be analog or digital signals, and may be sent over a communication medium. As described above, a communication medium may include one or more signal lines, and also may include drivers, buffers, and/or logic gates. Second processor 1004 is configured to execute second instructions (e.g., stored in second processor storage 1014) to provide Sense Control Signals to second circuit 1022 to test conditions of the non-volatile memory cells in response to the voltages applied to memory structure 126. The manner in which the conditions may be tested may include, but is not limited to, sensing, reading, detecting, measuring, probing, discovering, discriminating, checking, examining, and determining. For example, second processor 1004 may provide Sense Control Signals to control second circuit 1022 to determine a data state of the non-volatile memory cells. In an embodiment, second processor 1004 sends Sense Control Signals to data latch processor 192 (see FIG. 1B).

In an embodiment, second processor 1004 controls sensing circuit 1026 to test conditions of non-volatile memory cells in memory structure 126 in response to voltages applied to memory structure 126 (such as reference voltages applied to the non-volatile memory cells) by voltage generator 1024. The condition of a non-volatile memory cell can be any physical parameter of a non-volatile memory cell.

In an embodiment, second processor 1004 controls sensing circuit 1026 to determine a data state (e.g., S0-S7 in FIG. 4) of memory cells. In an embodiment, second processor 1004 controls sensing circuit 1026 to determine whether a memory cell conducts a current in response to voltages applied to the memory cell by voltage generator 1024. In an embodiment, second processor 1004 controls sensing circuit 1026 to determine whether the threshold voltage of a memory cell is above or below a reference voltage (e.g., Vr1-Vr7; Vv1-Vv7 in FIG. 4) applied to the memory cell.

For example, with reference to FIG. 4, second processor 1004 may provide Sense Control Signals to second circuit 1022 to determine the data state (e.g., S0-S7) of each of a set of memory cells. In an embodiment, second processor 1004 provides Sense Control Signals to second circuit 1022 to test whether selected memory cells have a threshold voltage above or below a reference voltage applied by power control circuit 116. The reference voltage might be one of Vr1-Vr7, with reference to FIG. 4, in the event that a read operation is being performed. The reference voltage might be one of Vv1-Vv7, with reference to FIG. 4, in the event that a program verify operation is being performed.

Second processor 1004 also may be referred to as a Sense Processor (SP). In some embodiments, Sense Processor 1004 alternatively may be referred to as a Y processor (YP) or Y machine (YM) due to the association between sensing and Y-decoder 132. In an embodiment, second processor 1004 executes instructions in second processor storage 1014 in response to a trigger signal ("Trigger Signal") from first processor 1002. This allows first processor 1002 to control the timing of sensing operations relative to the timing of voltages applied to memory structure 126 by first circuit 1020. Stated another way, this allows the activities (e.g., sensing) of second circuit 1022 to be coordinated with the activities (e.g., applying voltages to the memory structure 126) of first circuit 1020.

For example, during a sensing operation, first processor 1002 can control first circuit 1020 to establish appropriate voltage levels applied to memory cells. Then after appropriate voltage levels are applied to memory cells, first processor 1002 can trigger second processor 1004 to initiate a sensing operation (by second processor 1004 controlling second circuit 1022. The trigger signal may be an analog or digital signal. The trigger signal may be transmitted over a communication medium that may include one or more signal lines. The communication medium may include additional elements such as drivers, buffers, and/or logic gates.

First processor storage 1012 and second processor storage 1014 are tangible, non-transitory storage. The non-transitory storage can be volatile or non-volatile. First processor storage 1012 is used to store first instructions that are executed by first processor 1002. First processor storage 1012 also may be used to store parameters that first processor 1002 applies when executing the first instructions. Second processor storage 1014 is used to store second instructions that are executed by second processor 1004. Second processor storage 1014 also may be used to store parameters that second processor 1004 applies when executing the second instructions.

In one embodiment, a copy of the first instructions (and possibly parameters used by first processor 1002) and a copy of the second instructions (and possibly parameters used by second processor 1004) are stored in non-volatile storage to persist the first instructions and second instructions (and possible parameters) across power cycles. Those copies may be loaded into a volatile storage, which is accessed by the respective first processor 1002 and second processor 1004. For example, an instruction loader 1030 may load a copy of the first instructions and the second instructions (and possible parameters) from memory structure 126 into first processor storage 1012 and second processor storage 1014, respectively. Note that although first processor storage 1012 and second processor storage 1014 are depicted within microcontroller 112, first processor storage 1012 and second processor storage 1014 may reside outside of microcontroller 112.

Note that the first instructions and the second instructions and/or parameters in first processor storage 1012 and/or second processor storage 1014 can be modified to allow modification of the operation of first processor 1002 and/or second processor 1004. For example, the first instructions which first processor 1002 executes could be modified to change the timing of applying voltages to memory structure 126. For example, the second instructions which second processor 1004 executes could be modified to change conditions for sensing the non-volatile memory cells. In some cases, parameters could be modified to, for example, change the magnitude of voltages that are applied to word lines, select lines, etc.

An instruction updater 1032 may be used to update first instructions stored in first processor storage 1012 and second instructions stored in second processor storage 1014. Note that instruction updater 1032 might update a version of the instructions that are stored in memory structure 126, with instruction loader 1030 loading those instructions after a power reset. Instruction updater 1032 also may update parameters that are used when executing the instructions.

In an embodiment, first processor 1002 and second processor 1004 are able to fetch, decode, and execute instructions from their respective processor storage (1012, 1014), in one embodiment. In an embodiment, first processor 1002 and second processor 1004 can be implemented as microprocessors. A microcontroller 112 may include one or more processors that process and/or execute microcode or other computer executable code (e.g., an instruction set) to perform tasks or operations. First processor 1002 and second processor 1004 each may include elements such as of flip flops, latches, RAM/ROM, combinational logic, etc. In an embodiment, first processor 1002 and second processor 1004 are implemented using CMOS technology.

In an embodiment, microcontroller 112 is positioned on a substrate beneath a memory array included in memory structure 126. In an embodiment, microcontroller 112 resides on the same memory die as memory structure 126. In an embodiment, microcontroller 112 resides on the same memory die as memory structure 126, first circuit 1020, and second circuit 1022.

In an embodiment, instruction loader 1030 and instruction updater 1032 may take the form of packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system.

For example, each instruction loader 1030 and instruction updater 1032 may include an ASIC, an FPGA, a circuit, a digital logic circuit, an analog circuit, a combination of discrete circuits, gates, or any other type of hardware or combination thereof. Alternatively, or in addition, instruction loader 1030 and instruction updater 1032 may include software stored in a processor readable device (e.g., memory) to program one or more processors to perform the functions described herein.

Figure 10B:
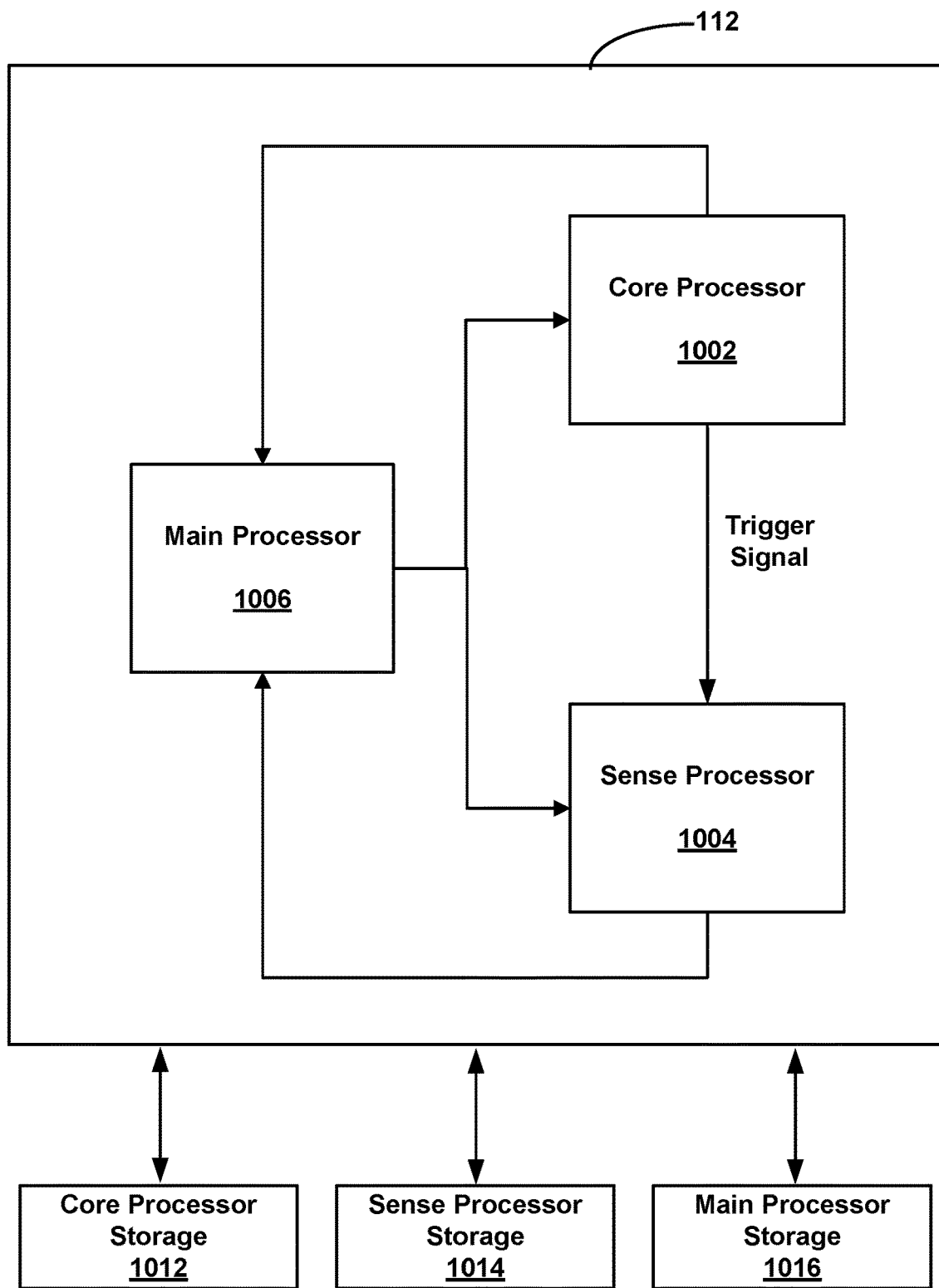
FIG. 10B is a high-level block diagram of one embodiment of a microcontroller having three processors.

FIG. 10B is a high-level block diagram of one embodiment of microcontroller 112. Microcontroller 112 includes a Main Processor 1006, a Core Processor 1002, and a Sense Processor 1004. Also depicted is Core Processor Storage 1012, Sense Processor Storage 1014, and a Main Processor Storage 1016.

Core Processor 1002 is an embodiment of first processor 1002 of FIG. 10A. In an embodiment, Core Processor 1002 has access to Core Processor Storage 1012. Sense Processor 1004 is an embodiment of second processor 1004 in FIG. 10A. In some embodiments, Sense Processor 1004 alternatively may be referred to as Y Processor 1004 or Y Machine 1004 because of the association between sensing and Y-decoder 132. In an embodiment, Sense Processor 1004 has access to Sense Processor Storage 1014. In an embodiment, Main Processor 1006 has access to Main Processor Storage. Main Processor Storage may be used to store third instructions executed by Main Processor 106. Main Processor Storage also may be used to store data (e.g., parameters), which may be applied by Main Processor 1006.

Main Processor 1006 also may be referred to as a Main Control Unit (MCU). In an embodiment, Main Processor 1006 provides algorithm flow control, such as steps in programming, reading, and erasing memory cells. In an embodiment, Main Processor 1006 also calculates magnitudes of analog voltages, such as program voltages and read reference voltages.

In an embodiment, Main Processor 1006 is a master, with Core Processor 1002 and Sense Processor 1004 being slaves to Main Processor 1006. Main Processor 1006 may direct Core Processor 1002 to execute selected first instructions in first processor storage 1012 to provide Core Control Signals to first circuit 1020 to coordinate sequences of voltages applied by first circuit 1020 to memory structure 126 for a particular memory operation. Main Processor 1006 may direct Sense Processor 1004 to execute selected second instructions in second processor storage 1014 to provide Sense Control Signals to second circuit 1022 to test conditions of a group of the non-volatile memory cells for the particular memory operation.

In an embodiment, Core Processor 1002 uses the Trigger Signal to cause Sense Processor 1004 to execute the selected instructions in second processor storage 1014. The trigger signal may be an analog or digital signal. The trigger signal allows Core Processor 1002 to control when to test the conditions relative to when voltages are applied to memory structure 126. The trigger signal may be sent over a communication medium, which may include one or more signal lines. The communication medium also may include one or more driver(s), buffer(s), and/or logic gate(s).

Core Processor 1002, Sense Processor 1004, and Main Processor 1006 are able to fetch, decode, and execute instructions from Core Processor Storage 1012, Sense Processor Storage 1014 and Main Processor Storage 1016, respectively. In an embodiment, Core Processor 1002, Sense Processor 1004, and Main Processor 1006 can be implemented as microprocessors. In an embodiment, a microcontroller 112 including Core Processor 1002, Sense Processor 1004, and Main Processor 1006 is positioned on a substrate beneath memory structure 126.

Figure 11:
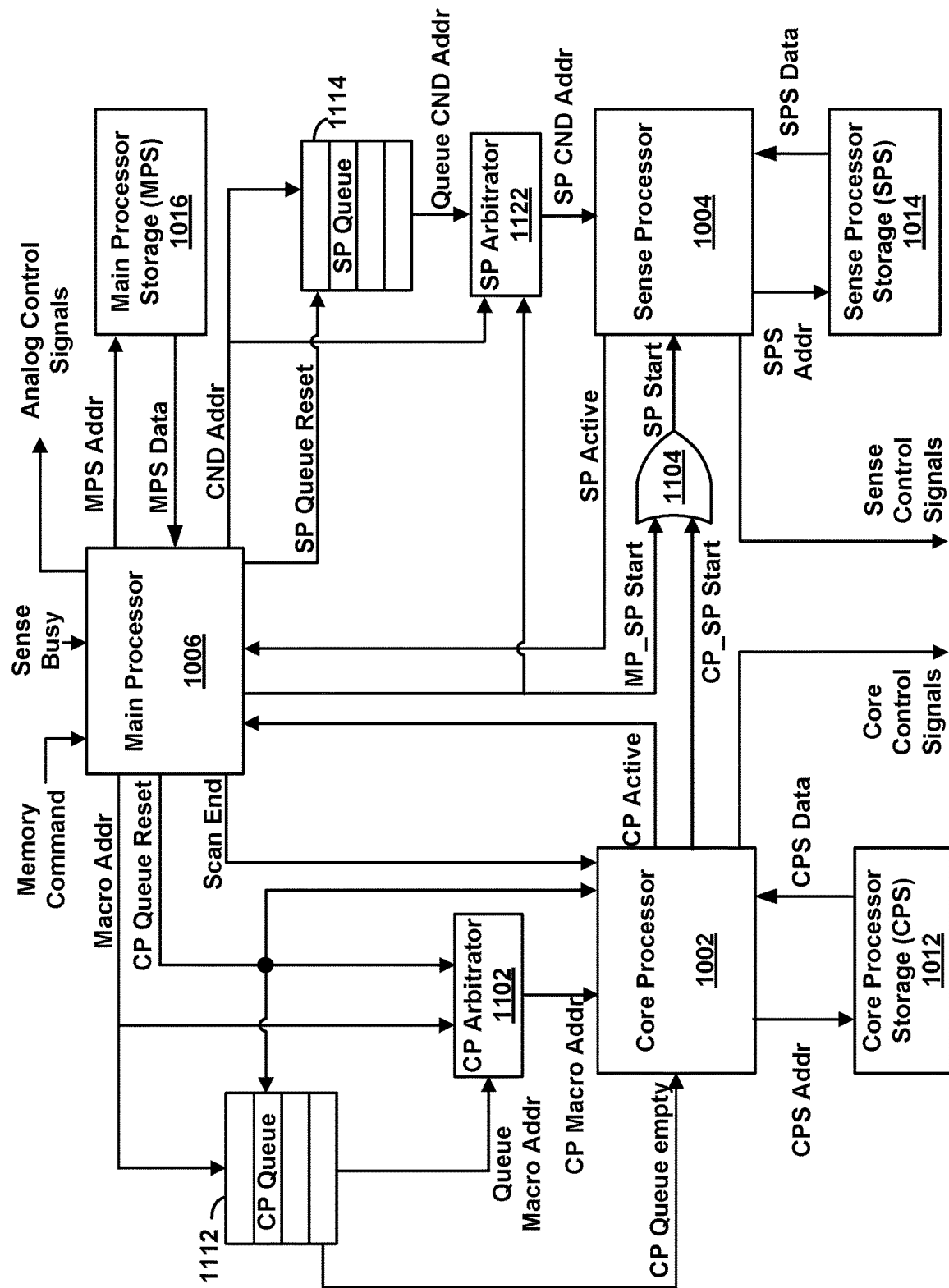
FIG. 11 is a more detailed block diagram of one embodiment of a microcontroller.

FIG. 11 is a more detailed block diagram of an embodiment of microcontroller 112. FIG. 11 shows an embodiment in which microcontroller 112 includes Main Processor 1006, Core Processor 1002, and Sense Processor 1004, Core Processor Storage 1012, Sense Processor Storage 1014, Main Processor (MP) Storage 1016, Core Processor (CP) Arbitrator 1102, Sense Processor (SP) Arbitrator 1122, OR gate 1104, CP Queue 1112, and SP Queue 1114.

In an embodiment, Main Processor Storage 1016, Core Processor Storage 1012, and Sense Processor Storage 1014 may include volatile memory (e.g., SRAM) that is loaded from memory structure 126 at power-on. For example, Core Processor Storage 1012 gets loaded with a set of first instructions for Core Processor 1006, Sense Processor Storage 1014 gets loaded with a set of second instructions for Sense Processor 1004, and Main Processor Storage 1016 gets loaded with a set of third instructions for Main Processor 1006. Information other than instructions (e.g., parameters) also may be loaded with one or more of the sets of instructions.

In an embodiment, one or more of Core Processor Storage 1012, Sense Processor Storage 1014 and/or Main Processor Storage 1016 may include non-volatile memory, such that loading from memory structure 126 at power-on is not required. In an embodiment, one or more of Core Processor Storage 1012, Sense Processor Storage 1014 and/or Main Processor Storage 1016 may include a combination of ROM and re-writeable RAM.

In an embodiment, memory structure 126 stores the instructions to be updated by, for example, instruction updater 1032 (which may reside in controller 122). In an embodiment, host 140 may send instructions to controller 122 to perform the update. In an embodiment, microcontroller 112 may store the updated instructions to memory structure 126, in response to a command from controller 122. Microcontroller 112 may then be power cycled to cause the first instructions, second instructions and third instructions in Core Processor Storage 1012, Sense Processor Storage 1014 and Main Processor Storage 1016, respectively, to be updated. In an embodiment, controller 122 directly updates the first instructions, second instructions and third instructions in Core Processor Storage 1012, Sense Processor Storage 1014 and Main Processor Storage 1016, respectively.

In an embodiment, some or all of Core Processor Storage 1012, Sense Processor Storage 1014 and Main Processor Storage 1016 may include non-volatile memory, and may include a combination of ROM and re-writeable RAM. In an embodiment, the re-writable RAM may be used to update one or more of the first instructions, second instructions and third instructions in Core Processor Storage 1012, Sense Processor Storage 1014 and Main Processor Storage 1016, respectively. In an embodiment, parameters may be updated in a similar manner as the instructions.

In an embodiment, Main Processor 1006 receives (e.g., from controller 122) a memory command such as program, read, erase, etc. The arrow between "Memory Command" and Main Processor 1006 represents a communication medium, in an embodiment. Note that the various other arrows in FIG. 11 also represent communication media, in an embodiment. As noted herein, a communication medium may include a signal line. The labels next to an arrow refer to the name of a signal that may be transferred over a signal line.

In an embodiment, Main Processor 1006 accesses third instructions from Main Processor Storage 1016 to control execution of the memory command (e.g., by controlling Core Processor 1002 and Sense Processor 1004). In an embodiment, Main Processor 1006 determines what set of third instructions Main Processor 1006 needs to execute for the memory command. In an embodiment, Main Processor Storage 1016 may contain more than one set of third instructions for a read command, as there may be different types of read operations.

Likewise, in an embodiment, Main Processor Storage 1016 may contain more than one set of third instructions for a program operation, as there may be different modes of program operations (e.g., SLC, MLC, TLC etc.). Note that, as the terms are used herein, SLC refers to storing a single bit per memory cell, MLC refers to storing two bits per memory cell, and TLC refers to storing three bits per memory cell. In an embodiment, Main Processor 1006 determines the addresses for the set of third instructions Main Processor 1006 needs to execute for the memory operation, and accesses third instructions at those addresses. Thus, Main Processor 1006 may send the addresses (MPS Addr) to Main Processor Storage 1016, which responds by returning the third instructions (MPS Data). In an embodiment, Main Processor 1006 also may access parameters from Main Processor Storage 1016.

"MPS Data" may include third instructions that Main Processor 1006 executes and parameters or the like used by Main Processor 1006. In an embodiment, Main Processor 1006 then executes this set of third instructions to control execution of the memory operation.

Main Processor 1006 outputs "Analog Control Signals." As one example, Analog Control Signals may be used to control at least some of the functionality of voltage generator 1024. These Analog Control Signals may be used to specify magnitudes of analog voltages (e.g., programming voltages, read reference voltages). Analog Control Signals may themselves be analog or digital signals. Analog Control Signals may be sent over a communication medium, which may include one or more signal lines. The communication medium also may include one or more driver(s), buffer(s), and/or logic gate(s).

CP Queue 1112 may be used to store addresses or other identifiers of first instructions in Core Processor Storage 1012. CP Queue 1112 also may be referred to as a CP Instruction Queue. SP Queue 1114 may be used to store addresses or other identifiers of second instructions in Sense Processor Storage 1014. SP Queue 1114 also may be referred to as an SP Instruction Queue. In an embodiment, CP Queue 1112 and SP Queue 1114 each are First-In First-Out (FIFO) queues.

Main Processor 1006 may control Core Processor 1002 and Sense Processor 1004 by supplying first instructions and second instructions, respectively, for those processors to execute. Main Processor 1006 may supply the instructions by supplying addresses or other identifiers of the instructions to CP Queue 1112 or SP Queue 1114. In an embodiment, Main Processor 1006 also may determine what first instructions and second instructions Core Processor 1002 and Sense Processor 1004, respectively, should execute for the memory operation.

In an embodiment, Core Processor 1002 may send the addresses (CPS Addr) to Core Processor Storage 1012, which responds by returning the first instructions (CPS Data). In an embodiment, Core Processor 1002 also may access parameters from Core Processor Storage 1012. "CPS Data" may include first instructions that Core Processor 1002 executes and parameters or the like used by Core Processor 1002. In an embodiment, Core Processor 1002 then executes this set of first instructions to provide Core Control Signals to first circuit 1020 to coordinate sequences of voltages applied by first circuit 1020 to memory structure 126 for a particular memory operation.

In an embodiment, Sense Processor 1004 may send the addresses (SPS Addr) to Sense Processor Storage 1014, which responds by returning the first instructions (SPS Data). In an embodiment, Sense Processor 1004 also may access parameters from Sense Processor Storage 1014. "SPS Data" may include first instructions that Sense Processor 1004 executes and parameters or the like used by Sense Processor 1004. In an embodiment, Sense Processor 1004 then executes this set of second instructions to test conditions of a group of the non-volatile memory cells for the particular memory operation.

In an embodiment, Main Processor 1006 determines an algorithm flow for executing the memory command it receives (e.g., from controller 122). In an embodiment, based on the algorithm flow, Main Processor 1006 determines one or more macros to be executed by Core Processor 1002. In an embodiment, each macro is a set of first instructions in Core Processor Storage 1012. Depending on the memory operation, there may be several macros for a single memory operation.

In an embodiment, a macro specifies a CTC operation for Core Processor 1002 to perform. For example, a CTC operation may cause Core Processor 1002 to provide Core Control Signals to first circuit 1020 to apply a sequence of voltages to memory structure 126. In particular, a CTC operation may include timing for voltages applied to a selected word line, unselected word lines, select lines, etc. In an embodiment, Main Processor 1006 sends an address or other identifier of the macro(s) (referred to as Macro Addr in FIG. 11) to CP Queue 1112.

In an embodiment, Main Processor 1006 also determines one or more conditions for Sense Processor 1004 to test, for the memory operation. In an embodiment, these conditions are connected to CTC operations. For example, Main Processor 1006 may determine a condition for which Sense Processor 1004 is to test for a specific CTC operation. Main Processor 1006 determines a set of second instructions in Sense Processor Storage 1014 for the condition. In an embodiment, Main Processor 1006 sends an address or other identifier of the second instructions (referred to as CND Addr in FIG. 11) to the SP Queue 1114.

Core Processor 1002 is connected to CP Queue 1112, CP Arbitrator 1102, OR gate 1104, Main Processor 1006, and Core Processor Storage 1012. In an embodiment, Core Processor 1002 executes the next first instruction in the CP Queue 1112, whenever CP Queue 1112 is not empty. In an embodiment, the "CP Queue empty" signal may inform Core Processor 1002 whether there is another first instruction in CP Queue 1112. Thus, CP Queue 1112 may be triggered to start executing a macro (or other set of first instructions) in response to Main Processor 1006 placing, for example, an address of the macro in CP Queue 1112.

In an embodiment, Core Processor 1002 may output a set of Core Control Signals in response to executing the first instructions. For example, Core Processor 1002 may output a set of Core Control Signals to first circuit 1020 (not shown in FIG. 11) for a CTC operation. These Core Control Signals may control charge pumps, decoders, etc., to apply voltages to word lines, select lines, etc. These Core Control Signals may control voltage generator 1024. Note that a given CTC operation may include applying a sequence of voltages having different magnitudes to the same line (e.g., word line) as time progresses. For example, the magnitude of voltage applied to the selected word line can change during the CTC operation.

In an embodiment, microcontroller 112 has a CP Arbitrator 1102. In the embodiment of FIG. 11, CP Arbitrator 1102 is connected between CP Queue 1112 and Core Processor 1002. CP Arbitrator 1102 can either supply Core Processor 1002 a Macro address (or Macro identifier) from CP Queue 1112, or an interrupt routine address or identifier (that is not on CP Queue 1112). This allows CP Arbitrator 1102 to supply Core Processor 1002 with, for example, an address of an interrupt routine. Thus, CP Arbitrator 1102 may be used for (controller or user/host) interrupts and power drops, after which CP Arbitrator 1102 sends a new first instruction to Core Processor 1002.

CP Arbitrator 1102 also may flush CP Queue 1112 in response to an interrupt. In an embodiment of a soft interrupt occurrence, CP Arbitrator 1102 selects a macro from Core Processor Storage 1012, which is used for the interrupt. In an embodiment in which Core Processor 1002 directly accesses CP Queue 1112, CP Arbitrator 1102 may place an address of an interrupt routine on CP Queue 1112. Note that Main Processor 1006 also may use CP Queue Reset to flush CP Queue 1112. Note that in FIG. 11 the information that CP Arbitrator 1102 pulls from CP Queue 1112 is referred to as "Queue Macro Addr," and the information that CP Arbitrator 1102 supplies to Core Processor 1002 is referred to as "CP Macro Addr."

Sense Processor 1004 is connected to Sense Processor Storage 1014, SP Arbitrator 1122, OR gate 1104, and Main Processor 1006. In an embodiment, Sense Processor 1004 executes the next second instruction (or set of second instructions) in SP Queue 1114 in response to the SP Start signal (which is an example of a trigger signal). In an embodiment, Core Processor 1002 may trigger Sense Processor 1004 by issuing the CP_SP Start signal to OR gate 1104. Main Processor 1006 may trigger Sense Processor 1004 by use of the MP_SP start signal to OR gate 1104.

In an embodiment, Main Processor 1006 may over-ride the ability of Core Processor 1002 to trigger Sense Processor 1004. Thus, in an embodiment, there is a hierarchy in which Main Processor 1006 is a master to both Core Processor 1002 and Sense Processor 1004, and in which Core Processor 1002 may execute some amount of control over Sense Processor 1004.

In an embodiment, Core Processor 1002 may trigger Sense Processor 1004 to test for a certain condition with respect to a CTC operation that Core Processor 1002 is executing. For example, Core Processor 1002 may execute first instructions for a CTC operation and output Core Control Signals to first circuit 1020 (not shown in FIG. 11) for the CTC operation. Core Processor 1002 may trigger Sense Processor 1004 at a certain time to execute second instructions to test for a condition of the memory cells with respect to the CTC operation.

In an embodiment, microcontroller 112 has an SP Arbitrator 1122. In the embodiment of FIG. 11, SP Arbitrator 1122 is connected between SP Queue 1114 and Sense Processor 1004. Note that in FIG. 11 the information that SP Arbitrator 1122 pulls from SP Queue 1114 is referred to as "Queue CND Addr," and the information that SP Arbitrator 1122 supplies to Sense Processor 1004 is referred to as "SP CND Addr."

In an embodiment, SP Arbitrator 1122 can either supply Sense Processor 1004 with a CND address (or CND identifier) from SP Queue 1114, or an interrupt routine address or identifier (that is not on SP Queue 1114). This allows SP Arbitrator 1122 to supply Sense Processor 1004 with, for example, an address of an interrupt routine. Thus, SP Arbitrator 1122 may be used for (controller or user/host) interrupts and power drops, after which SP Arbitrator 1122 sends a new second instruction to Sense Processor 1004. SP Arbitrator 1122 also may flush SP Queue 1114 in response to an interrupt. Note that Main Processor 1006 also may use SP Queue Reset to flush SP Queue 1114. In one embodiment, the Main Processor 1006 issues an MP_SP_Start signal to trigger the Sense Processor 1004 to execute an interrupt routine that is identified on the SP Queue 1114.

In an embodiment, Core Processor 1002 may use a "CP Active" signal to inform Main Processor 1006 whether Core Processor 1002 is active or not active. In an embodiment, Sense Processor 1004 may use a "SP Active" signal to inform Main Processor 1006 whether Sense Processor 1004 is active or not active. In an embodiment, Main Processor 1006 receives a "Sense Busy" signal from sensing circuit 1026. Thus, sensing circuit 1026 is able to inform Main Processor 1006 whether or not sensing circuit 1026 is busy with a sensing operation, or the like.

In an embodiment, Main Processor 1006 may send a "Scan End" signal to Core Processor 1002. The Scan End signal indicates that the operation being controlled by Sense Processor 1004 has completed. In an embodiment, Core Processor 1002 may determine when to send the next CP_SP_Start based on the Scan End signal. Core Processor 1002 also may determine when to send additional control signals to first circuit 1022, based on the Scan End signal. For example, in response to the sensing operation being over, Core Processor 1002 may send control signals to remove voltages that were applied to the memory structure just prior to the sensing operation.

Figure 12A:
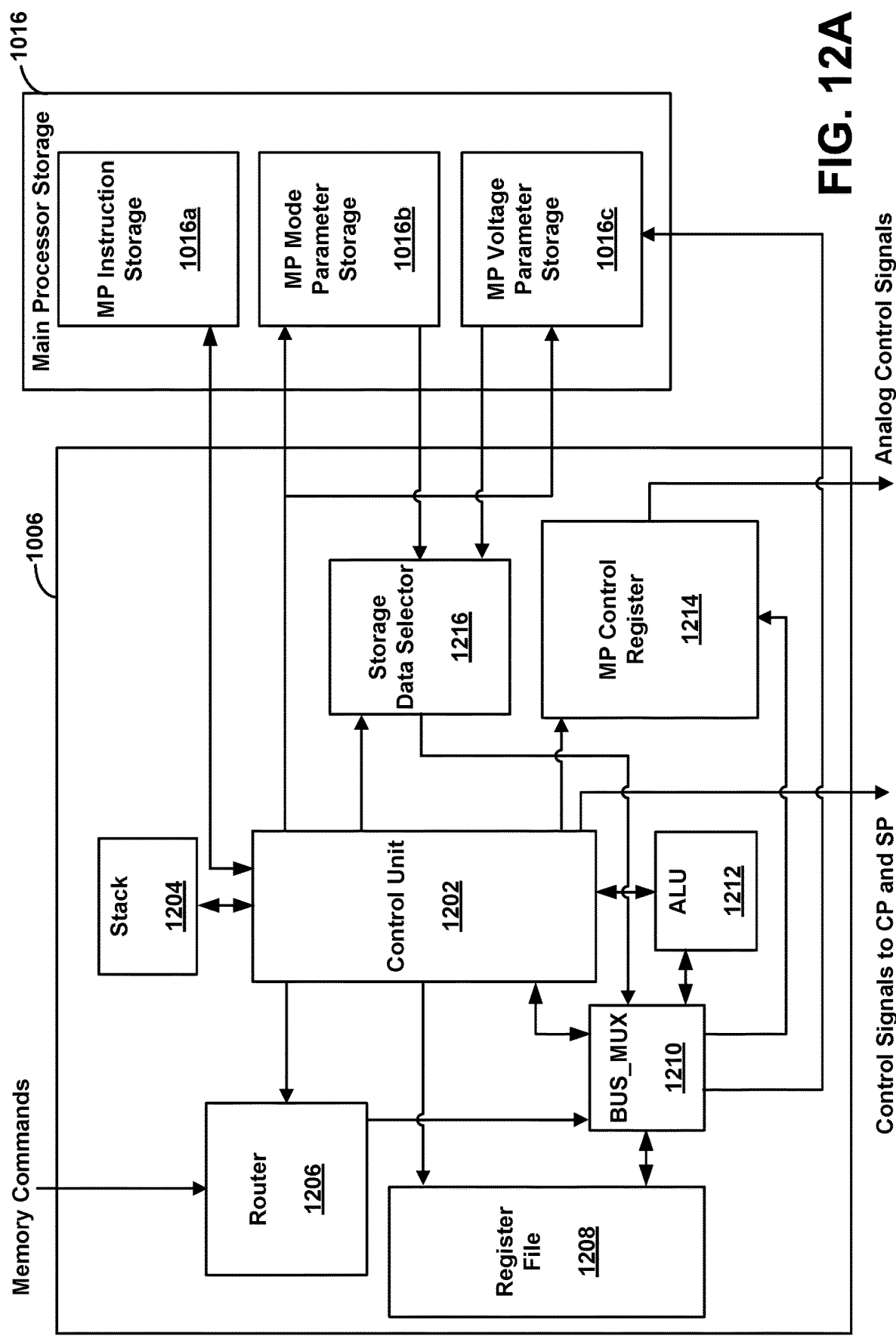
FIG. 12A is a block diagram of one embodiment of Main Processor, and Main Processor Storage.

FIG. 12A is a block diagram of an embodiment of Main Processor 1006 and Main Processor Storage 1016. Main Processor 1006 includes a Control Unit 1202 connected to a stack 1204, a router 1206, a Register File 1208, an arithmetic logic unit (ALU) 1212, an MP Control Register 1214, a Storage Data Selector 1216, and a BUS_MUX 1210.

In this embodiment, Main Processor Storage 1016 is divided between Main Processor Instruction Storage 1016a, Main Processor Mode Parameter Storage 1016b, and Main Processor Voltage Parameter Storage 1016c. Main Processor Instruction Storage 1016a may be used to store third instructions that are executed by Control Unit 1202. These third instructions may provide an algorithm that Main Processor 1006 performs to control execution of a memory command.

Main Processor Mode Parameter Storage 1016b may be used to store mode related parameters. Example "modes" are SLC, MLC, TLC, etc. Depending on the mode, the voltage magnitude may be different. For example, the read reference voltages for SLC will be different than those for TLC (e.g., see FIG. 4). Thus, Main Processor Mode Parameter Storage 1016b may store various parameters that may vary depending on the mode.

Main Processor Voltage Parameter Storage 1016c may be used to store parameters for operation of a Digital to Analog Converter (DAC) in voltage generator 1024. Storage Data Selector 1216 is used to select data from Main Processor Mode Parameter Storage 1016b and Main Processor Voltage Parameter Storage 1016c. Main Processor Voltage Parameter Storage 1016c may store parameters such as the step size (increment) in programming voltage from one program loop to the next. This may be used to calculate the increase in Vpgm in a programming process, such as in step 786 of the programming process of FIG. 5.

FIG. 12A shows Control Unit 1202 connected to a stack 1204, router 1206, Register File 1208, an arithmetic logic unit (ALU) 1212, MP Control Register 1214, Storage Data Selector 1216, Main Processor Instruction Storage 1016a, Main Processor Mode Parameter Storage 1016b, Main Processor Voltage Parameter Storage 1016c, and BUS_MUX 1210. The various arrows in FIG. 12A refer to communication media, in one embodiment.

Control Unit 1202 outputs control signals to Core Processor 1002 and Sense Processor 1004 (Core Processor 1002 and the Sense Processor 1004 are not depicted in FIG. 12). Examples of these control signals were discussed in the discussion of FIG. 11. The control signals may identify instructions for Core Processor 1002 and Sense Processor 1004 to execute. With reference to FIG. 11, Core Processor 1002 may be connected to CP Queue 1112, CP Arbitrator 1102, Core Processor 1002, SP Queue 1114, SP Arbitrator 1122, Sense Processor 1004, as well as logic such as OR gate 1104.

MP Control Register 1214 includes a set of registers for external signals "Analog Control Signals." As one example, Analog Control Signals may be used to control at least some of the functionality of voltage generator 1024. For example, the Analog Control Signals may control the magnitude of voltages output by drivers 550. Control Unit 1202 may use MP Control Register 1214 to issue control signals to control, for example, drivers 550. These control signals may be used to specify magnitudes of analog voltages (e.g., programming voltages, read reference voltages).

ALU 1212 performs arithmetic and logical operations. Control Unit 1202 uses ALU 1212 to determine magnitudes for analog voltages (e.g., programming voltages, read reference voltages). As one example, the program voltage may increase by a certain increment each programming loop. This increment may be a parameter in Main Processor Voltage Parameter Storage 1016c. Note that the value of a parameter such as this can easily be changed by modifying the value stored in Main Processor Voltage Parameter Storage 1016c. Note that for some architectures, the value of such a parameter may be hard-coded, such that it is very difficult to modify.

When controller 122 sends a memory command to Main Processor 1006, the memory command is first processed by router 1206. In an embodiment, router 1206 divides the memory operations based on the type of memory operation, such as program, read, erase. In an embodiment, router 1206 includes a MUX to route the memory operations. Based on the memory command, Control Unit 1202 fetches, decodes and executes the instruction from Main Processor Instruction Storage 1016a. Stack 1204 is used to store temporary program counter (pc) address with a Last In First Out (LIFO) mechanism during program execution. Register File 1208 may be used for temporary storage locations to hold data and addresses.

In an embodiment, Main Processor Mode Parameter Storage 1016b and Main Processor Voltage Parameter Storage 1016c may share the same bus. Storage Data Selector 1216 may be used to select between Main Processor Mode Parameter Storage 1016b and MP Voltage Parameter Storage 1016c. There may be a separate bus for the Main Processor Instruction Storage 1016a for high performance. In an embodiment, BUS_MUX 1210 may act as a MUX for Register File 1208 and Router 1206 to access Main Processor Mode Parameter Storage 1016b and Main Processor Voltage Parameter Storage 1016c.

FIG. 12B is a diagram of an embodiment of a processor 1215. Processor 1215 may be used to implement Core Processor 1002 or Sense Processor 1004. In an embodiment, processor 1215 is used to implement Main Processor 1006. Processor Storage 1280 could be Core Processor Storage 1012, Sense Processor Storage 1014, or Main Processor Storage 1016.

Processor 1215 includes a program counter 1250 that may be used to store the address of an instruction in Processor Storage 1280. An instruction fetcher 1220 is configured to fetch an instruction identified by program counter 1250 from Processor Storage 1280. An instruction decoder 1230 is configured to decode the instruction. In an embodiment, the instruction has an operation code (opcode). Note that Core Processor 1002, Sense Processor 1004, and Main Processor 1006 each may have different instruction sets.

An instruction executer 1240 is configured to execute the decoded instructions. Registers 1260 may be used for temporary storage of parameters. In an embodiment, Main Processor 1006 has an ALU 1270. In an embodiment, an ALU 1270 is optional for Core Processor 1002 and Sense Processor 1006. The elements in processor 1215 may include, but are not limited to, one or more of a microprocessor, an electrical circuit, an application specific integrated circuit (ASIC), a Field Programmable Gate Array (FPGA), a digital logic circuit, an analog circuit, gates, flip flops, latches, RAM/ROM, and/or combinational logic.

Referring again to FIG. 10A, microcontroller 112 includes first processor 1002, which provides first control signals to first circuit 1020, and second processor 1004, which provides second control signals to second circuit 1022. In an embodiment, first processor 1002 is configured to provide first control signals to first circuit 1020 to control analog voltages (e.g., word line voltages, select line voltages, etc.) applied by first circuit 1020 to memory structure 126, control decoders and charge pumps in first circuit 1020, and control voltage levels applied by sense modules (e.g., sense modules SM0, SM1, SM2 and SM3 in FIG. 1B). As described above, second processor 1004 is configured to provide second control signals to second circuit 1022 to test conditions of the non-volatile memory cells in response to the voltages applied to memory structure 126.

In an embodiment, first control signals are binary signals, and first processor 1002 provides first control signals via a signal bus to first circuit 1020. In an embodiment, the signal bus includes physical signal lines coupled between first processor 1002 and first circuit 1020. If first processor 1002 is located near and/or on a same level on or above a substrate as first circuit 1020, routing the signal bus between first processor 1002 and first circuit 1020 may not be difficult. However, in some embodiments, first processor 1002 may be located far from and/or on a different level on or above a substrate than first circuit 1020.

For example, in some embodiments first processor 1002 is located in a first area, and first circuit 1020 is located in a second area remote from first area. For example, in some embodiments microcontroller 112 (and first processor 1002) are located in a substrate beneath a memory array included in memory structure 126, and first circuit 1020 is part of or located near memory structure 126. Thus, in such embodiments first processor 1002 may be located far from and/or on a different level on or above a substrate than first circuit 1020.

In some embodiments, the number of first control signals may be quite large (e.g., several thousand in some embodiments). As a result, routing a large number of physical signal lines between first processor 1002 (located in a first area) and first circuit 1020 (located in a second area remote from first area) may be quite difficult. In particular, in embodiments in which first processor 1002 is located in a substrate beneath memory structure 126 and first circuit 1020, the available space for routing the physical signal lines between first processor 1002 and first circuit 1020 may be quite limited. One technique to address this routing issue is to increase the size of the die to provide additional space for routing physical signal lines. However, increasing die size typically increases die cost and decreases die yield and is therefore not ideal.

To address this problem, technology is described to reduce a number of physical signal lines used to couple first control signals from first processor 1002 to first circuit 1020. In particular, in embodiments in which first processor 1002 is located in a first area and first circuit 1020 is located in a second area remote from the first area, it is believed that reducing a number of first physical signal lines may simplify the task of routing first physical signal lines between first processor 1002 and first circuit 1020.

Figure 13A:
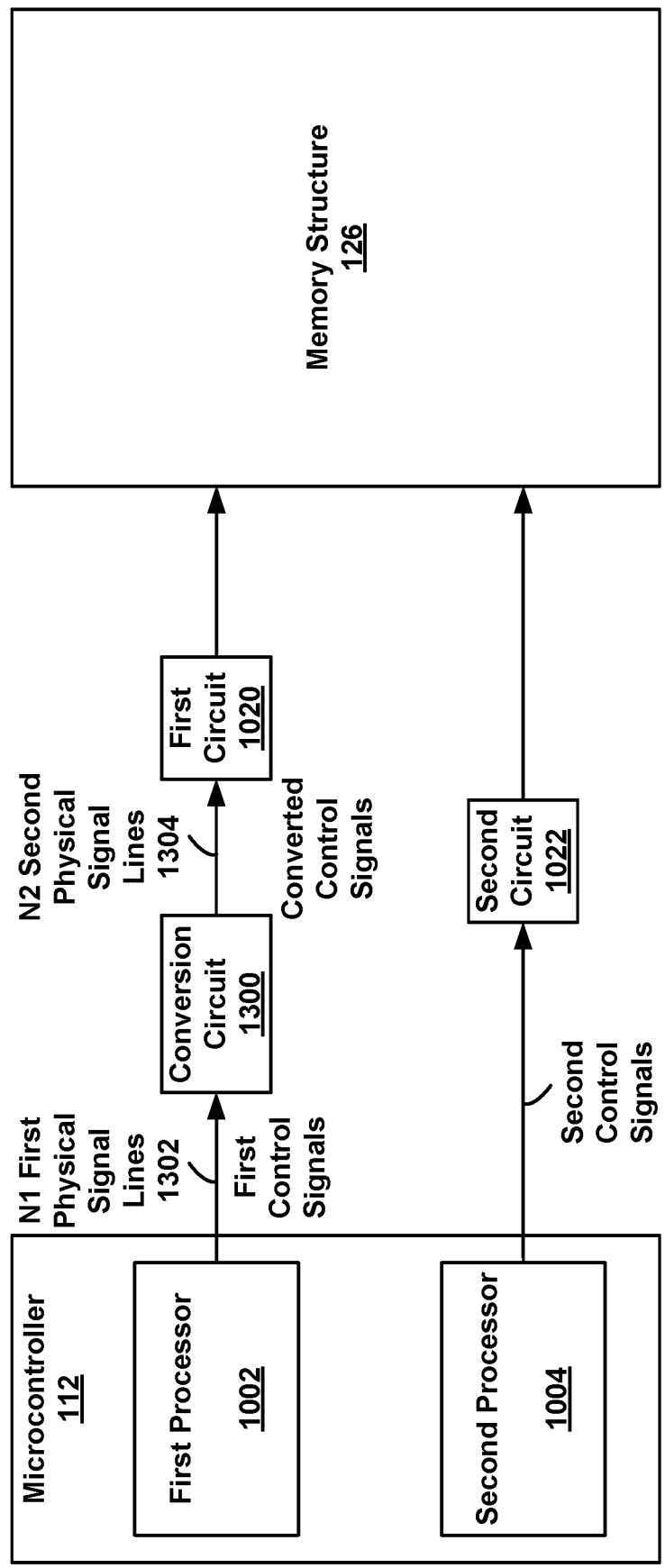
FIGS. 13A-13D are high-level block diagrams of embodiments of a microcontroller, a memory structure, a first circuit, a second circuit and a conversion circuit.

FIG. 13A is a high-level block diagram of an embodiment of microcontroller 112, memory structure 126, first circuit 1020, second circuit 1022 and a conversion circuit 1300. In an embodiment, memory structure 126 includes first circuit 1020 and conversion circuit 1300. In other embodiments, first circuit 1020 and conversion circuit 1300 may be separate from memory structure 126.

Microcontroller 112 includes first processor 1002 and second processor 1004. First processor 1002 is coupled via a first number N1 of first physical signal lines 1302 to conversion circuit 1300, which is coupled via a second number N2 of second physical signal lines 1304 to first circuit 1020. In an embodiment, first number N1 is less than second number N2. As described in more detail below, conversion circuit 1300 reduces a number of first physical signal lines 1302 that are coupled between first processor 1002 and first circuit 1020.

In an embodiment, microcontroller 112 (including first processor 1002) is located at a first area, and first circuit 1020 and conversion circuit 1300 are located at a second area remote from first area. For example, in an embodiment microcontroller 112 (including first processor 1002) is located in a substrate (a first area), and memory structure 126, first circuit 1020 and conversion circuit 1300 are located above the substrate (a second area) above first processor 1002.

In an embodiment, first processor 1002 is configured to provide a third number N3 of groups of first control signals via N1 first physical signal lines 1302 to conversion circuit 1300. Each of the N3 groups includes N1 first control signals, for a total of N2=N1×N3 first control signals. In an embodiment, conversion circuit 1300 is configured to receive N3 groups of first control signals via N1 first physical signal lines 1302 in a serial fashion one group at a time, and convert the received first control signals to a parallel output at N2 second physical signal lines 1304.

In an embodiment, first number N1=16, third number N3=16, and second number N2=N1×N3=256. In other embodiments, first number N1 may be greater or lesser than 16, third number N3 may be greater or lesser than 16, and second number N2 may be greater or lesser than 256.

In an embodiment, first physical signal lines 1302 comprise an N1-bit bus, and second physical signal lines 1304 comprise an N2-bit bus. In an embodiment, first processor 1002 is configured to provide N3 groups of first control signals N1 bits at a time to conversion circuit 1300 via N1-bit bus 1302, and conversion circuit 1300 is configured to receive N3 groups of first control signals in a serial fashion one group at a time via N1-bit bus 1302, convert the received first control signals to a parallel arrangement of N2 converted control signals, and provide the converted control signals via N2-bit bus 1304 to first circuit 1020.

In an embodiment, first number N1 is less than second number N2 to reduce the number of first physical signal lines 1302 that are coupled between first processor 1002 and first circuit 1020. Reducing the number of first physical signal lines 1302 should thereby reduce the number of first physical signal lines 1302 that must be routed between first processor 1002 and first circuit 1020.

For example, with N1=16, N3=16, and N2=256, first physical signal lines 1302 comprise a 16-bit bus, and second physical signal lines 1304 comprise a 256-bit bus. First processor 1002 is configured to provide 16 groups of first control signals 16 bits at a time to conversion circuit 1300 via the 16-bit bus 1302. Conversion circuit 1300 is configured to receive 16 groups of first control signals in a serial fashion one group at a time via 16-bit bus 1302, convert the received first control signals to a parallel arrangement of 256 converted control signals, and provide the converted control signals via 256-bit bus 1304 to first circuit 1020. Without conversion circuit 1300, 256 first physical signal lines would be required to be routed between first processor 1002 and first circuit 1020. Thus, conversion circuit 1300 reduces a number of first physical signal lines 1302 coupled between first processor 1002 and first circuit 1020.

In embodiments in which first processor 1002 is located in a first area and first circuit 1020 and conversion circuit 1300 are located in a second area remote from the first area, it is believed that reducing a number of first physical signal lines 1302 may simplify the task of routing first physical signal lines 1302 between first processor 1002 and conversion circuit 1300 and first circuit 1020.

For example, in embodiments in which first processor 1002 is located in a substrate beneath memory structure 126, first circuit 1020 and conversion circuit 1300, and in which the available space for routing the physical signal lines between first processor 1002 and conversion circuit 1300 and first circuit 1020 is limited, it is believed that reducing a number of first physical signal lines 1302 may simplify the task of routing first physical signal lines 1302 between first processor 1002 and conversion circuit 1300 and first circuit 1020.

Figure 13B:
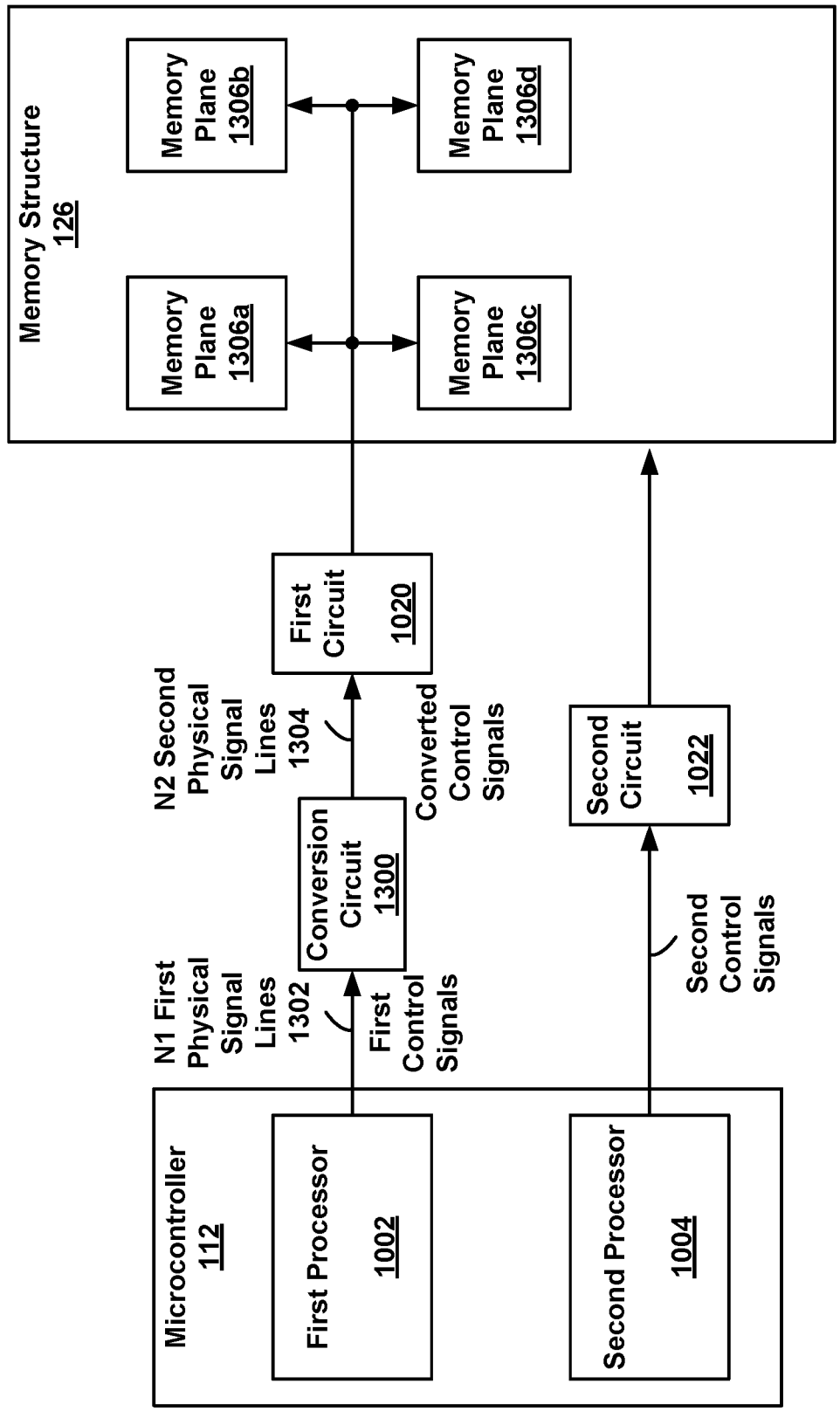

FIG. 13B is a high-level block diagram of another embodiment of microcontroller 112, memory structure 126, first circuit 1020, second circuit 1022 and conversion circuit 1300. In an embodiment, memory structure 126 includes first circuit 1020 and conversion circuit 1300. In other embodiments, first circuit 1020 and conversion circuit 1300 may be separate from memory structure 126.

Memory structure 126 includes one or more planes of non-volatile memory cells. In an embodiment, memory structure 126 includes four memory planes 1306a, 1306b, 1306c and 1306d, although more or fewer than four memory planes may be used. Each of memory planes 1306a, 1306b, 1306c and 1306d includes multiple non-volatile memory cells.

In embodiments, memory planes 1306a, 1306b, 1306c and 1306d may be located on the same level or on different levels above a substrate, such as a wafer. In an embodiment, memory planes 1306a, 1306b, 1306c and 1306d are all located on a same level on or above a substrate. In other embodiments, memory planes 1306a, 1306b, 1306c and 1306d may be located on different levels on or above a substrate.

In an embodiment, microcontroller 112 (including first processor 1002) is located at a first area, and first circuit 1020 and conversion circuit 1300 are located at a second area remote from first area. For example, in an embodiment microcontroller 112 (including first processor 1002) is located in a substrate (a first area), and memory structure 126, first circuit 1020 and conversion circuit 1300 are located above the substrate (a second area) above first processor 1002. In an embodiment, first circuit 1020 and conversion circuit 1300 are located on a same level on or above a substrate as memory planes 1306a, 1306b, 1306c and 1306d.

In embodiments in which first processor 1002 is located in a first area and first circuit 1020 and conversion circuit 1300 are located in a second area remote from the first area, it is believed that reducing a number of first physical signal lines 1302 may simplify the task of routing first physical signal lines 1302 between first processor 1002 and conversion circuit 1300 and first circuit 1020.

For example, in embodiments in which first processor 1002 is located in a substrate beneath memory structure 126, first circuit 1020 and conversion circuit 1300, and in which the available space for routing the physical signal lines between first processor 1002 and conversion circuit 1300 and first circuit 1020 is limited, it is believed that reducing a number of first physical signal lines 1302 may simplify the task of routing first physical signal lines 1302 between first processor 1002 and conversion circuit 1300 and first circuit 1020.

Figure 13C:
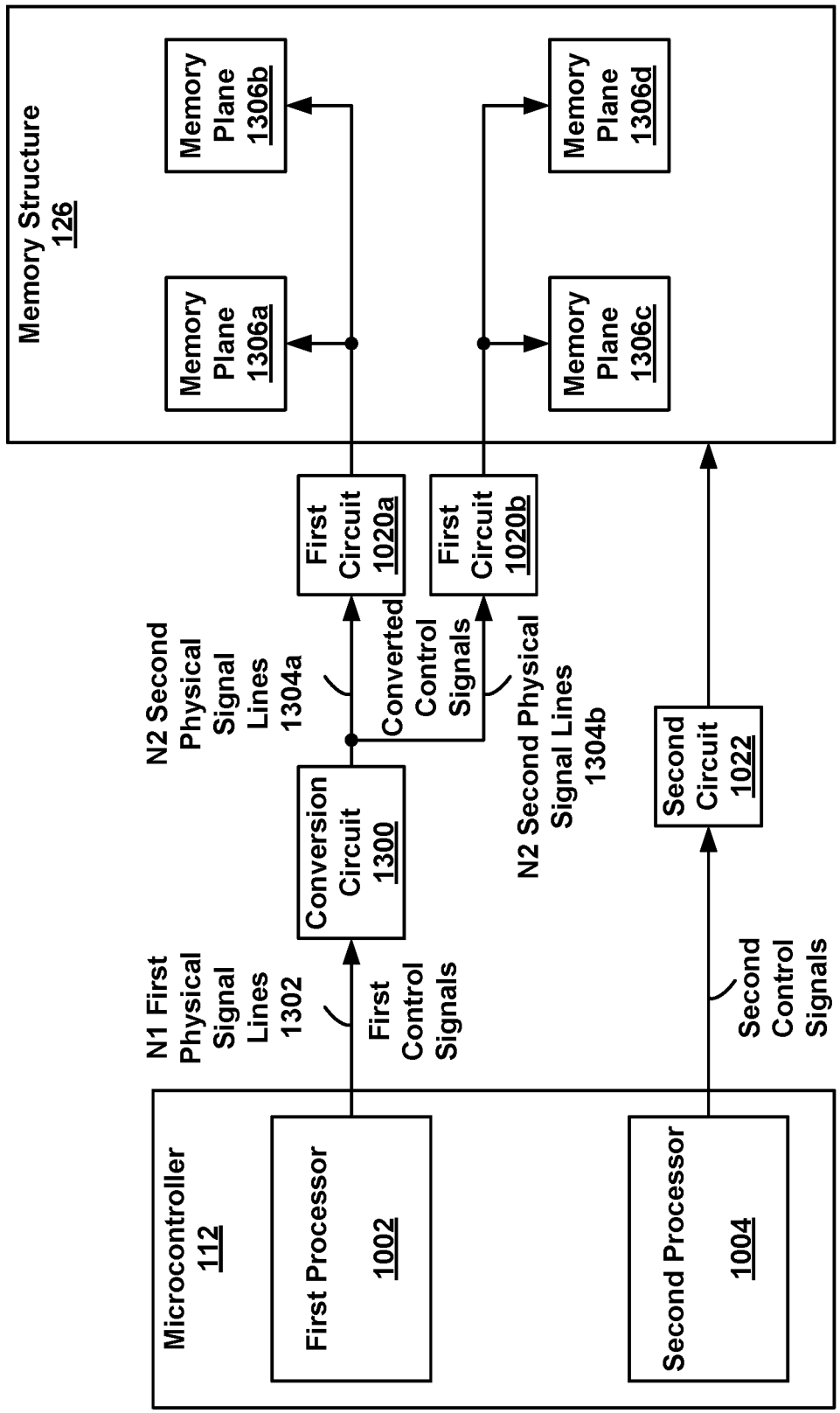

FIG. 13C is a high-level block diagram of an embodiment of microcontroller 112, memory structure 126, first circuit 1020 (which includes a first first circuit 1020a and a second first circuit 1020b), second circuit 1022 and conversion circuit 1300. In an embodiment, memory structure 126 includes first circuit 1020 and conversion circuit 1300. In other embodiments, first circuit 1020 and conversion circuit 1300 may be separate from memory structure 126.

Memory structure 126 includes one or more planes of non-volatile memory cells. In an embodiment, memory structure 126 includes four memory planes 1306*a*, 1306*b*, 1306*c* and 1306*d*. Each of memory planes 1306*a*, 1306*b*, 1306*c* and 1306*d* includes multiple non-volatile memory cells. In embodiments, first first circuit 1020*a* and second first circuit 1020*b* may include the same circuits or different circuits. For example, first first circuit 1020*a* and second first circuit 1020*b* may be identical copies of first circuit 1020 of FIG. 13B.

In an embodiment, first first circuit 1020*a* and memory planes 1306*a* and 1306*b* are on a first level on or above a substrate, and second first circuit 1020*b* and memory planes 1306*c* and 1306*d* are on a second level on or above a substrate, and the first level and second level are different levels on or above a substrate.

In an embodiment, microcontroller 112 (including first processor 1002) is located at a first area, and first first circuit 1020*a*, second first circuit 1020*b* and conversion circuit 1300 are located at a second area remote from first area. For example, in an embodiment microcontroller 112 (including first processor 1002) is located in a substrate (a first area), and memory structure 126, first first circuit 1020*a*, second first circuit 1020*b* and conversion circuit 1300 are located above the substrate (a second area) above first processor 1002.

In embodiments in which first processor 1002 is located in a first area and first first circuit 1020*a*, second first circuit 1020*b* and conversion circuit 1300 are located in a second area remote from the first area, it is believed that reducing a number of first physical signal lines 1302 may simplify the task of routing first physical signal lines 1302 between first processor 1002 and conversion circuit 1300, first first circuit 1020*a* and second first circuit 1020*b*.

For example, in embodiments in which first processor 1002 is located in a substrate beneath memory structure 126, first first circuit 1020*a*, second first circuit 1020*b* and conversion circuit 1300, and in which the available space for routing the physical signal lines between first processor 1002 and conversion circuit 1300, first first circuit 1020*a* and second first circuit 1020*b* is limited, it is believed that reducing a number of first physical signal lines 1302 may simplify the task of routing first physical signal lines 1302 between first processor 1002 and conversion circuit 1300, first first circuit 1020*a* and second first circuit 1020*b*.

Figure 13D:
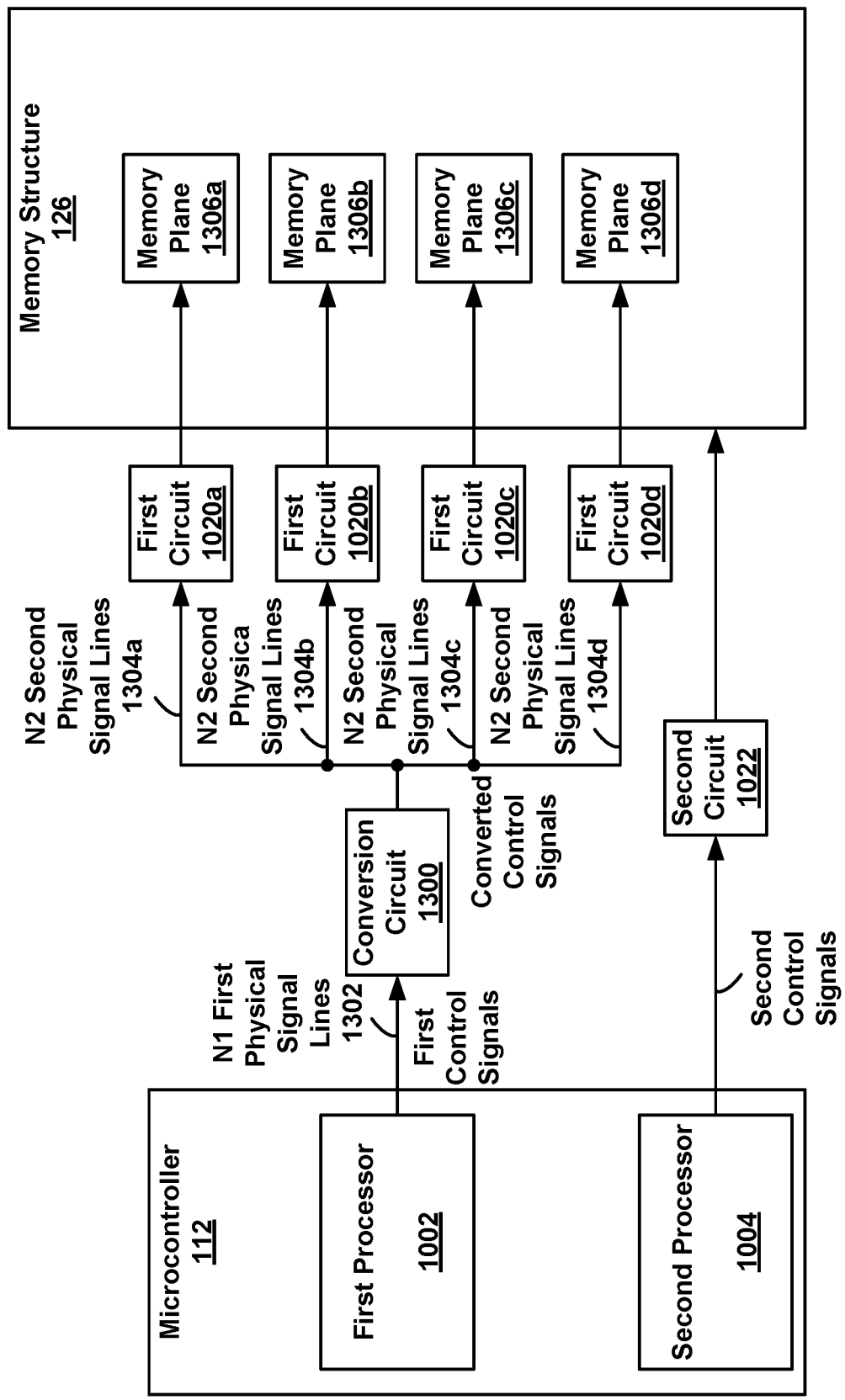

FIG. 13D is a high-level block diagram of an embodiment of microcontroller 112, memory structure 126, first circuit 1020 (which includes a first first circuit 1020*a*, a second first circuit 1020*b*, a third first circuit 1020*c* and a fourth first circuit 1020*d*), second circuit 1022 and conversion circuit 1300. In an embodiment, memory structure 126 includes first circuit 1020 and conversion circuit 1300. In other embodiments, first circuit 1020 and conversion circuit 1300 may be separate from memory structure 126.

Memory structure 126 includes one or more planes of non-volatile memory cells. In an embodiment, memory structure 126 includes four memory planes 1306*a*, 1306*b*, 1306*c* and 1306*d*. Each of memory planes 1306*a*, 1306*b*, 1306*c* and 1306*d* includes multiple non-volatile memory cells. In embodiments, first first circuit 1020*a*, second first circuit 1020*b*, third first circuit 1020*c* and fourth first circuit 1020*d* may include the same circuits or different circuits. For example, first first circuit 1020*a*, second first circuit 1020*b*, third first circuit 1020*c* and fourth first circuit 1020*d* may be identical copies of first circuit 1020 of FIG. 13B.

In an embodiment, first first circuit 1020*a* and memory plane 1306*a* are on a first level on or above a substrate, second first circuit 1020*b* and memory plane 1306*b* are on a second level on or above a substrate, third first circuit 1020*c* and memory plane 1306*c* are on a third level on or above a substrate, fourth first circuit 1020*d* and memory plane 1306*d* are on a fourth level on or above a substrate, and the first level, second level, third level and fourth level are different levels on or above a substrate.

In an embodiment, microcontroller 112 (including first processor 1002) is located at a first area, and first first circuit 1020*a*, second first circuit 1020*b*, third first circuit 1020*c*, fourth first circuit 1020*d* and conversion circuit 1300 are located at a second area remote from first area. For example, in an embodiment microcontroller 112 (including first processor 1002) is located in a substrate (a first area), and memory structure 126, first first circuit 1020*a*, second first circuit 1020*b*, third first circuit 1020*c*, fourth first circuit 1020*d* and conversion circuit 1300 are located above the substrate (a second area) above first processor 1002.

In embodiments in which first processor 1002 is located in a first area and first first circuit 1020*a*, second first circuit 1020*b*, third first circuit 1020*c*, fourth first circuit 1020*d* and conversion circuit 1300 are located in a second area remote from the first area, it is believed that reducing a number of first physical signal lines 1302 may simplify the task of routing first physical signal lines 1302 between first processor 1002 and conversion circuit 1300, first first circuit 1020*a*, second first circuit 1020*b*, third first circuit 1020*c* and fourth first circuit 1020*d*.

For example, in embodiments in which first processor 1002 is located in a substrate beneath memory structure 126, first first circuit 1020*a*, second first circuit 1020*b*, third first circuit 1020*c*, fourth first circuit 1020*d* and conversion circuit 1300, and in which the available space for routing the physical signal lines between first processor 1002 and conversion circuit 1300, first first circuit 1020*a*, second first circuit 1020*b*, third first circuit 1020*c* and fourth first circuit 1020*d* is limited, it is believed that reducing a number of first physical signal lines 1302 may simplify the task of routing first physical signal lines 1302 between first processor 1002 and conversion circuit 1300, first first circuit 1020*a*, second first circuit 1020*b*, third first circuit 1020*c* and fourth first circuit 1020*d*.

In the embodiments of FIGS. 13A-13D, microcontroller 112 includes first processor 1002 configured to serially provide N3 groups of first control signals via N1 first physical signal lines 1302 (Bus1) to first sub-circuit 1300*a*. Persons of ordinary skill in the art will understand that the technology described herein also may be used with a state machine that is coupled via N1 first physical signal lines 1302 (Bus1) to first sub-circuit 1300*a*, and provides N3 groups of first control signals N1-bits at a time via first physical signal lines 1302 (Bus1) to first sub-circuit 1300*a*. As in embodiments that include microcontroller 112, conversion circuit 1300 reduces a number of first physical signal lines 1302 coupled between the state machine and first circuit 1020.

Figure 14A:
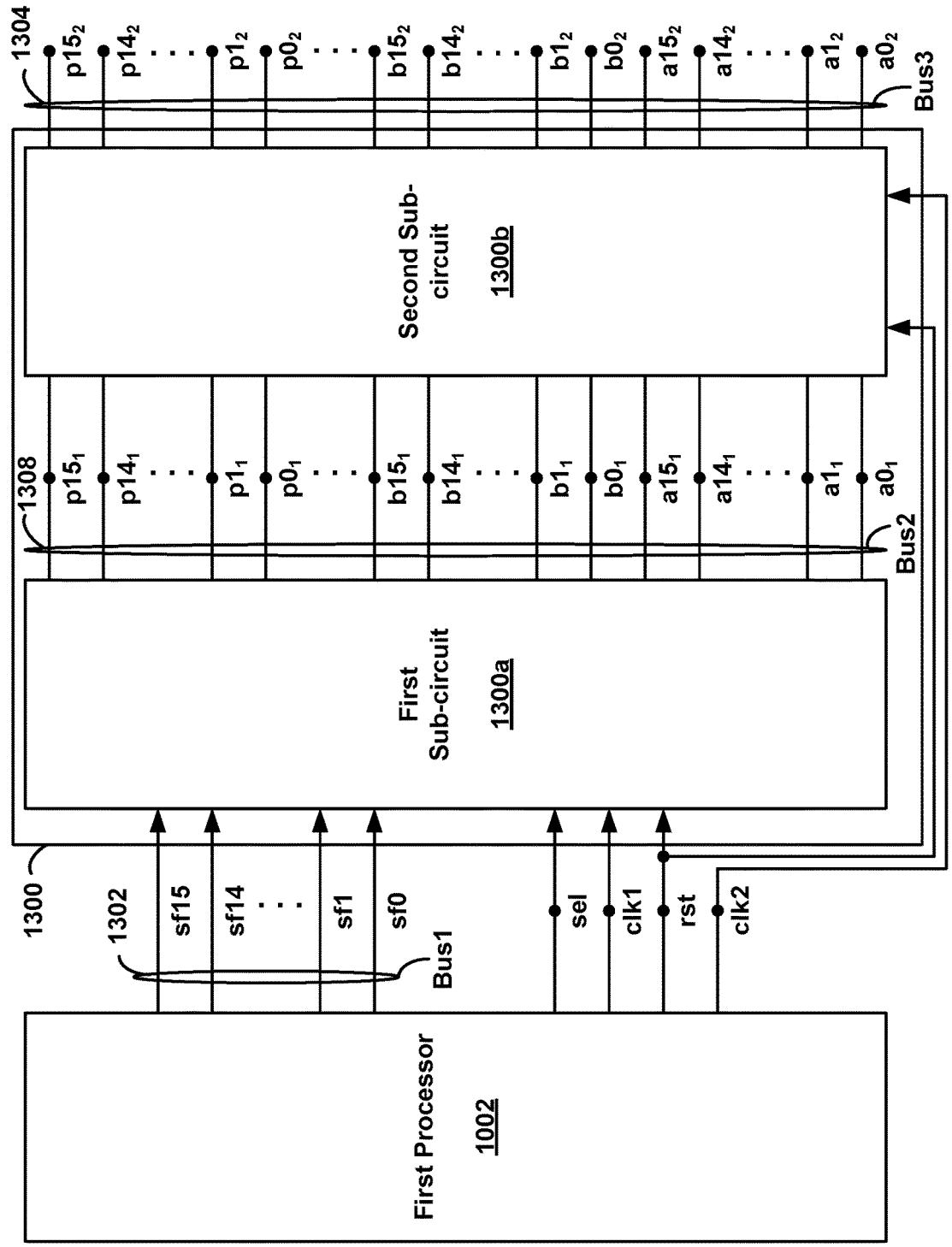
FIG. 14A is a high-level block diagram of an embodiment of a first processor and a conversion circuit.

FIG. 14A is a high-level block diagram of an embodiment of first processor 1002 and conversion circuit 1300. Conversion circuit 1300 includes a first sub-circuit 1300*a* and a second sub-circuit 1300*b*. As described in more detail below, an embodiment of conversion circuit 1300 includes a serial-in and parallel-out pipeline circuit configured to reduce a number of first physical signal lines 1302 coupled between first processor 1002 and first circuit 1020. As described in more detail below, an embodiment of conversion circuit 1300 includes a two-stage pipeline structure, with first sub-circuit 1300a being a first stage and second sub-circuit 1300b being a second stage of the two-stage pipeline structure configured to reduce a number of first physical signal lines 1302 coupled between first processor 1002 and first circuit 1020. As described in more detail below, an embodiment of first sub-circuit 1300a is a pre-fetch circuit and a an embodiment of second sub-circuit 1300b is a fetch circuit configured to reduce a number of first physical signal lines 1302 coupled between first processor 1002 and first circuit 1020.

First processor 1002 is coupled via N1 first physical signal lines 1302 (also referred to herein as "Bus1") to first sub-circuit 1300a, which is coupled via N2 third physical signal lines 1308 (also referred to herein as "Bus2") to second sub-circuit 1300b. Second sub-circuit 1300b provides output signals at N2 second physical signal lines 1304 (also referred to herein as "Bus3"). First processor 1002 provides a first clock signal clk1, a group select signal sel, and a reset signal rst to first sub-circuit 1300a, and provides a second clock signal clk2 and reset signal rst to second sub-circuit 1300b.

In an embodiment, first processor 1002 is configured to serially provide N3 groups of first control signals via N1 first physical signal lines 1302 (Bus1) to first sub-circuit 1300a. Each of the N3 groups includes N1 first control signals, for a total of N2=N1×N3 first control signals. In an embodiment, first sub-circuit 1300a is configured to receive N3 groups of first control signals via N1 first physical signal lines 1302 (Bus1) in a serial fashion one group at a time, convert the received first control signals to N2 parallel-output fourth signals, and provide the N2 fourth signals to second sub-circuit 1300b via N2 third physical signal lines 1308 (Bus2). In an embodiment, first sub-circuit 1300a is configured to reset values of the N2 fourth signals based on reset signal rst (e.g., when rst is HIGH, first sub-circuit 1300a resets the N2 fourth signals to 0).

In an embodiment, second sub-circuit 1300b is configured to receive N2 fourth signals via N2 third physical signal lines 1308 (Bus2), convert the received fourth signals to N2 converted control signals and output the converted control signals via N2 second physical signal lines 1304 (Bus 3). In an embodiment, second sub-circuit 1300b is configured to output the converted control signals on second physical signal lines 1304 (Bus 3) based on second clock signal clk2. In an embodiment, second sub-circuit 1300b is configured to reset values of the N2 converted control signals based on reset signal rst (e.g., when rst is HIGH, second sub-circuit 1300a resets the N2 converted control signals to 0).

In an embodiment, on each cycle of first clock signal clk1 (e.g., on each a falling edge of first clock signal clk1), first processor 1002 serially provides an N1-bit group of first control signals via first physical signal lines 1302 (Bus 1) to first sub-circuit 1300a. In an embodiment, first processor 1002 allocates the N2 first control signals into N3 groups of first signals, and provides an associated group select signal sel to identify the particular group of first signals being provided via first physical signal lines 1302 (Bus 1) to first sub-circuit 1300a. In this regard, first processor 1002 serially provides the N3 groups to first sub-circuit 1300a. In an embodiment, first sub-circuit 1300a converts the serially-provided groups of first control signals to a parallel output fourth signals at third physical signal lines 1308 (Bus2). In an embodiment, first processor 1002 allocates related first control signals (e.g., first control signals likely to transition together) into the N3 groups of first control signals.

For example, with N1=16, N3=16 and N2=256, first processor 1002 is configured to serially provide 16 groups of first control signals to first sub-circuit 1300a via the 16-bit first physical signal lines 1302 (Bus 1). In an embodiment, each group includes 16 first control signals sf0, sf1, sf2, ..., sf15. In this example, group select signal sel may be a 4-bit signal that may be used to identify which of the 16 groups of first control signals first processor 1002 provides to first sub-circuit 1300a. In an embodiment, first sub-circuit 1300a converts the serially-provided first control signals sf0, sf1, sf2, ..., sf15 to a parallel arrangement of 256 fourth signals $a0_1, \ldots, a14_1, a15_1, b0_1, b1_1, \ldots, b14_1, b15_1, \ldots, o14_1, o15_1, p0_1, p1_1, \ldots, p14_1, p15_1$ at third physical signal lines 1308 (Bus2).

Figure 14B:
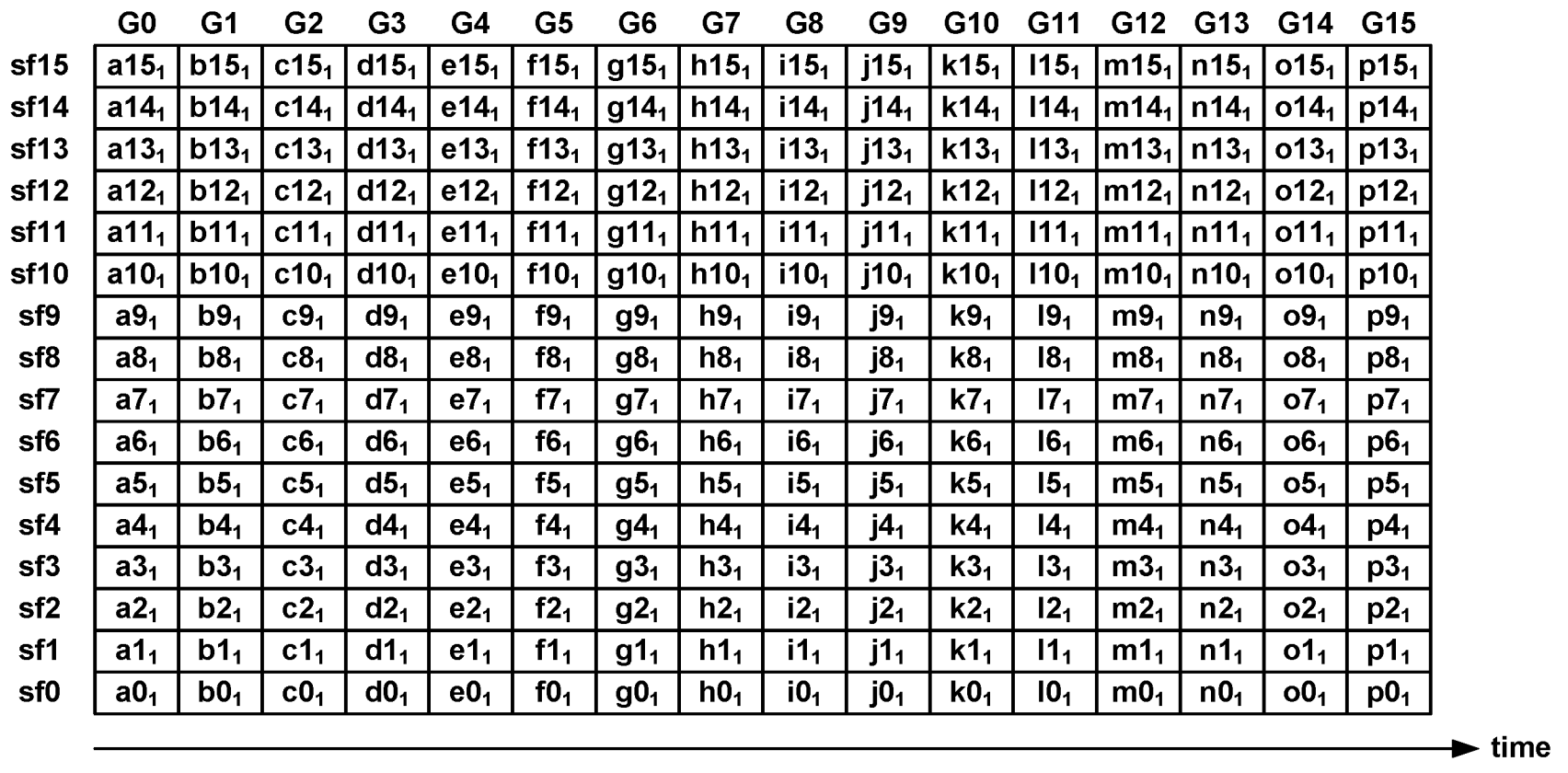

FIG. 14B is a chart depicting an example conversion relationship between the serially-provided 16 groups G0, G1, ..., G15 of first control signals sf0, sf1, sf2, ..., sf15 to 256 fourth signals $a0_1, a1_1, \ldots, p14_1, p15_1$. For example, first sub-circuit 1300a converts group G0 first control signals sf0, sf1, sf2, ..., sf15 to fourth signals $a0_1, a1_1, \ldots, a14_1, a15_1$, first sub-circuit 1300a converts group G1 first control signals sf0, sf1, sf2, ..., sf15 to fourth signals $b0_1, b1_1, \ldots, b14_1, b15_1$, and so on.

Figure 14C:
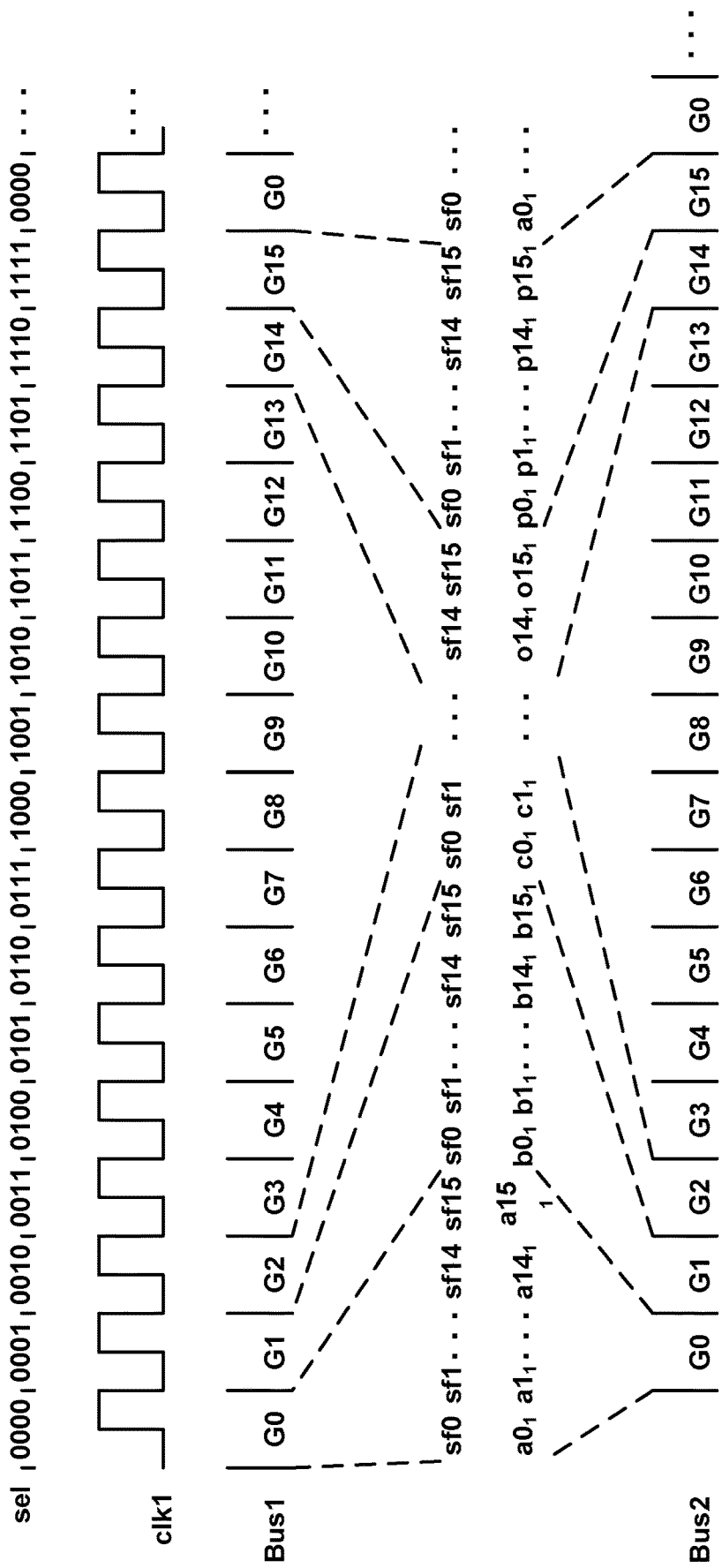
FIG. 14C is an example timing diagram for first processor and conversion circuit of FIG. 14A.

FIG. 14C is an example timing diagram for first processor 1002 and conversion circuit 1300 of FIG. 14A. On each cycle of first clock signal clk1, first processor 1002 provides one of the 16 groups of first control signals sf0, sf1, sf2, ..., sf15 via first physical signal lines 1302 (Bus1) to first sub-circuit 1300a, and provides an associated group select signal sel to identify which of the 16 groups of first control signals is being provided to first sub-circuit 1300a.

In an embodiment, on a first cycle of first clock signal clk1, first processor 1002 provides a first group G0 of first control signals sf0, sf1, sf2, ..., sf15 via first physical signal lines 1302 (Bus1) to first sub-circuit 1300a, and provides associated group select signal sel=0000 to identify the group being provided to first sub-circuit 1300a. In an embodiment, first sub-circuit 1300a converts the received first control signals sf0, sf1, sf2, ..., sf15 from group G0 to a corresponding parallel output of fourth signals $a0_1, a1_1, \ldots, a14_1, a15_1$ at third physical signal lines 1308 (Bus2).

On a second cycle of first clock signal clk1, first processor 1002 provides a second group G1 of first control signals sf0, sf1, sf2, ..., sf15 via first physical signal lines 1302 (Bus1) to first sub-circuit 1300a, and provides associated group select signal sel=0001 to identify the group being provided to first sub-circuit 1300a. First sub-circuit 1300a converts the received first control signals sf0, sf1, sf2, ..., sf15 from group G1 to a corresponding parallel output of fourth signals $b0_1, b1_1, \ldots, b14_1, b15_1$ at third physical signal lines 1308 (Bus2). In an embodiment, this process continues with the remaining 14 groups G2, G3, ..., G15 of first control signals sf0, sf1, sf2, ..., sf15, with first sub-circuit 1300a converting each received group of first control signals sf0, sf1, sf2, ..., sf15 from groups G2, G3, ..., G15 to a corresponding parallel output of fourth signals $c0_1, c1_1, \ldots, p14_1, p15_1$ at third physical signal lines 1308 (Bus2).

In the example depicted in FIG. 14C, first processor 1002 provides groups of first control signals sf0, sf1, sf2, ..., sf15 in sequential numerical order (e.g., G0, G1, G2, ...). In other embodiments, first processor 1002 may provide groups of first control signals sf0, sf1, sf2, ..., sf15 in any order (e.g., G0, G4, G12, G3, G0, G9, G3, ...). Because first processor 1002 provides an associated group select signal sel with each group of first control signals, first sub-circuit 1300a receives a group of first control signals sf0, sf1, sf2, ..., sf15 and the associated group select signal sel that identifies the group to which the received first control signals belongs, and first sub-circuit 1300a then converts the received group of first control signals sf0, sf1, sf2, ..., sf15 to the corresponding parallel output of fourth signals.

In the example of FIG. 14C, first processor 1002 provides N3=16 groups of first control signals one group at a time to first sub-circuit 1300a in 16 cycles of first clock signal clk1. In other embodiments, first processor 1002 may provide more or less than N3=16 groups of first control signals to first sub-circuit 1300a.

Referring again to FIG. 14A, first sub-circuit 1300a converts serially-received groups of first control signals at first physical signal lines 1302 (Bus 1) to parallel output fourth signals $a0_1, a1_1, \ldots, p14_1, p15_1$ at third physical signal lines 1308 (Bus2) in 16 cycles of first clock signal clk1. Second sub-circuit 1300b is configured to receive N2 fourth signals $a0_1, a1_1, \ldots, p14_1, p15_1$ at third physical signal lines 1308 (Bus2) from first sub-circuit 1300a, and output the received fourth signals via N2 second physical signal lines 1304 (Bus 3) as N2 converted control signals $a0_2, a1_2, \ldots, p14_2, p15_2$ synchronized to second clock signal clk2 (e.g., on a falling edge of second clock signal clk2). In this regard, second sub-circuit 1300b can update converted control signals $a0_2, a1_2, \ldots, p14_2, p15_2$ on second physical signal lines 1304 (Bus 3) at predetermined times based on second clock signal clk2.

Figure 14D:
FIG. 14D is an example timing diagram for first processor and second sub-circuit of FIG. 14A.

FIG. 14D is an example timing diagram for first processor 1002 and second sub-circuit 1300b of FIG. 14A. At time t0, the N2 fourth signals on third physical signal lines 1308 (Bus2) from first sub-circuit 1300a have values $a0_{10}, a1_{10}, \ldots, p14_{10}, p15_{10}$. On the falling edge of second clock signal clk2 at time ta, second sub-circuit 1300b outputs the received fourth signals $a0_{10}, a1_{10}, \ldots, p14_{10}, p15_{10}$ on second physical signal lines 1304 (Bus 3) as N2 converted control signals $a0_2, a1_2, \ldots, p14_2, p15_2$.

At time t1, the N2 fourth signals on third physical signal lines 1308 (Bus2) from first sub-circuit 1300a have values $a0_{11}, a1_{11}, \ldots, p14_{11}, p15_{11}$. On the falling edge of second clock signal clk2 at time tb, second sub-circuit 1300b outputs the received fourth signals $a0_{11}, a1_{11}, \ldots, p14_{11}, p15_{11}$ on second physical signal lines 1304 (Bus 3) as N2 converted control signals $a0_2, a1_2, \ldots, p14_2, p15_2$.

At time t2, the N2 fourth signals on third physical signal lines 1308 (Bus2) from first sub-circuit 1300a have values $A0_{12}, a1_{12}, \ldots, p14_{12}, p15_{12}$. On the falling edge of second clock signal clk2 at time tc, second sub-circuit 1300b outputs the received fourth signals $a0_{12}, a1_{12}, \ldots, p14_{12}, p15_{12}$ on second physical signal lines 1304 (Bus 3) as N2 converted control signals $a0_2, a1_2, \ldots, p14_2, p15_2$.

Thus, in an embodiment, conversion circuit 1300 constitutes a serial-in and parallel-out pipeline circuit: first sub-circuit 1300a is configured to convert N3 groups of first control signals, serially received one group at a time, to N2 parallel-output fourth signals, and provide the N2 fourth signals to second sub-circuit 1300b via N2 third physical signal lines 1308.

In an embodiment, conversion circuit 1300 includes a two-stage pipeline structure, with first sub-circuit 1300a comprising a first stage and second sub-circuit 1300b comprising a second stage of the two-stage pipeline structure.

In an embodiment, first sub-circuit 1300a is a pre-fetch circuit and a second sub-circuit 1300b is a fetch circuit. That is, first sub-circuit 1300a pre-fetches and stores first control signals during a first time interval (e.g., N3 cycles of first clock clk1), and second sub-circuit 1300b fetches the stored first control signals as converted control signals during a second time interval (e.g., on a falling edge of second clock signal clk2).

Figure 15A:
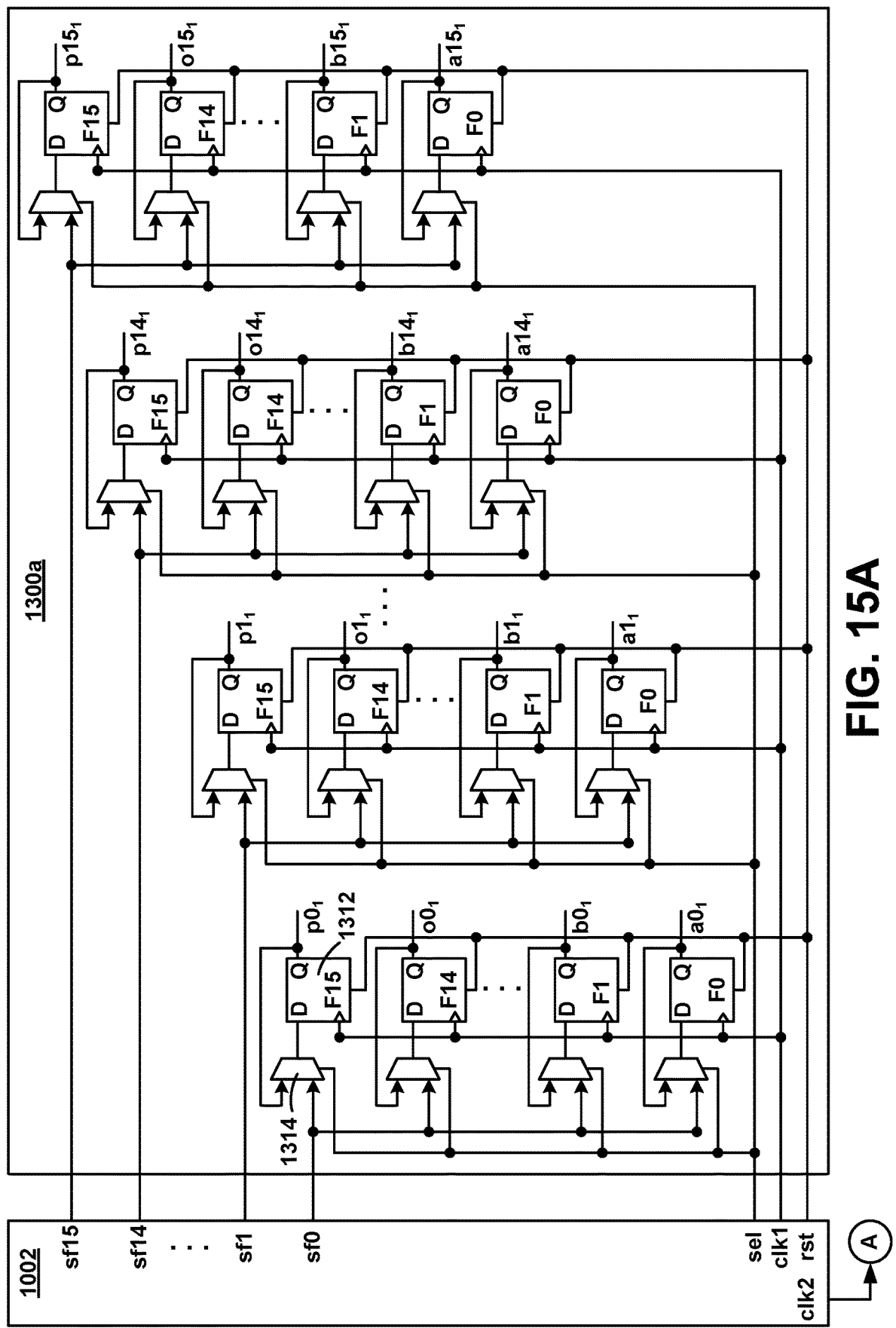
FIG. 15A is a block diagram of an embodiment of a first sub-circuit of FIG. 14A.
Figure 15B:
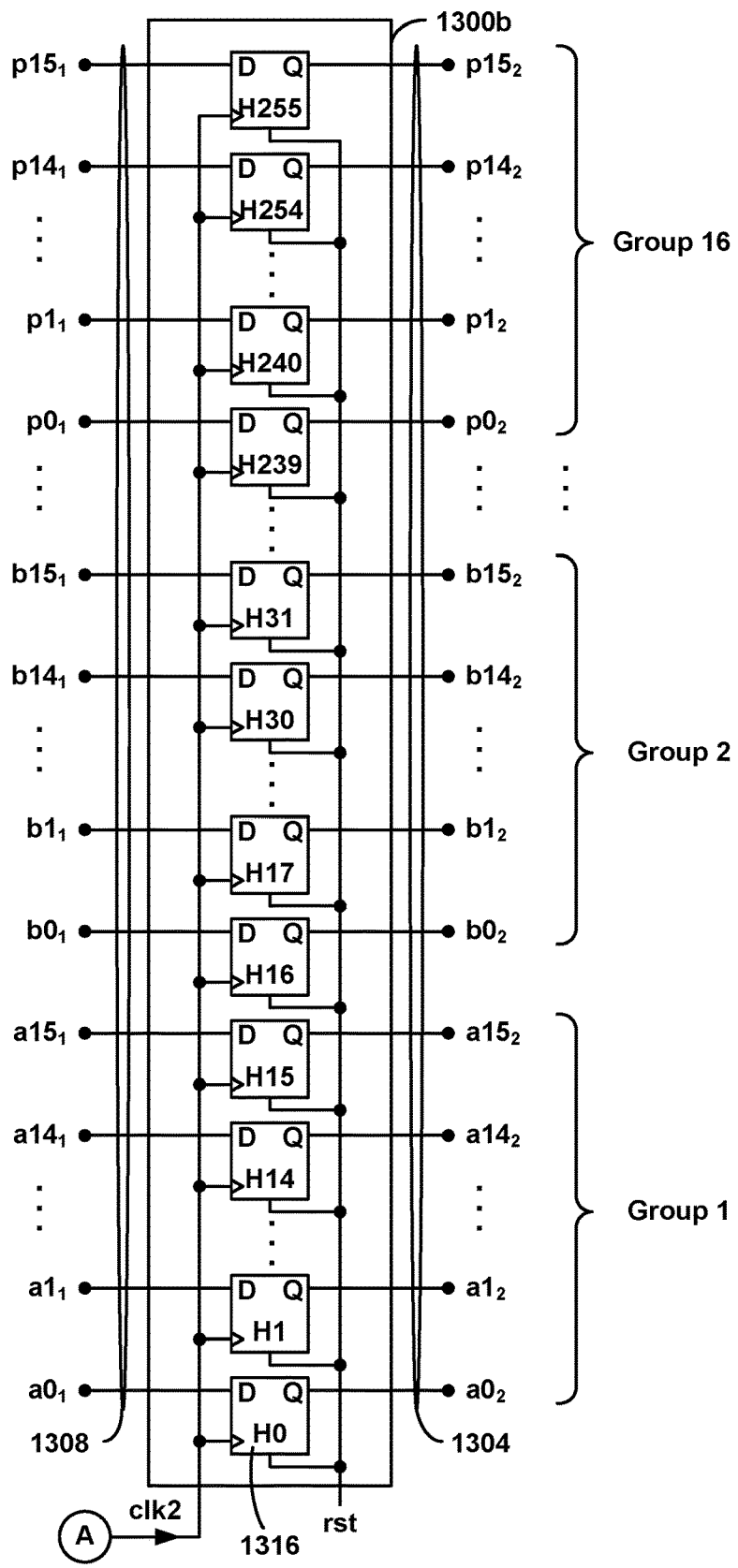
FIG. 15B is a block diagram of an embodiment of a second sub-circuit of FIG. 14A.

In an embodiment, first sub-circuit 1300a and second sub-circuit are implemented as a two-stage flip-flop pipeline structure. FIG. 15A is a block diagram of an embodiment of a first sub-circuit 1300a of FIG. 14A of such a two-stage flip-flop pipeline structure, and FIG. 15B is a block diagram of an embodiment of a second sub-circuit 1300b of FIG. 14A of such a two-stage flip-flop pipeline structure.

In the embodiment of FIG. 15A, first sub-circuit 1300a includes N1 banks of flip-flops 1312 and associated 2:1 multiplexors (MUXES) 1314, with each bank including N3 flip-flop/MUX pairs. In an embodiment, flip-flops 1312 are falling edge-triggered D-flip-flops, although other flip-flops may be used. Each flip-flop 1312 includes a data (D) input, a clock input, a reset input and an output (Q). Each flip-flop 1312 is coupled to an associated MUX 1314. Each MUX 1314 has a first input coupled to one of first control signals sf0, sf1, sf2, ..., sf15, a second input coupled to the Q output of the associated flip-flops 1312, and a select input coupled to group select signal sel. To simplify the remaining discussion, assume that N1=16, N3=16 and, N2=256, and group select signal sel is a four-bit binary signal.

Each of the N1=16 banks of flip-flop/MUX pairs is coupled to a corresponding one of first control signals sf0, sf1, sf2, ..., sf15. For example, in a first bank of flip-flop/MUX pairs, the first input of each MUX 1314 is coupled to first signal sf0, in a second bank of flip-flop/MUX pairs, the first input of each MUX 1314 is coupled to first signal sf1, and so on. In the 16th bank of flip-flop/MUX pairs, the first input of each MUX 1314 is coupled to first signal sf15.

Each bank includes N3=16 flip-flop/MUX pairs, and flip-flops 1312 in each bank form a shift register. For example, the first bank has a first flip-flop F0 that provides an output fourth signal $a0_1$, a second flip-flop F1 that provides an output fourth signal $b0_1$, and so on until a sixteenth flip-flop F15 that provides an output fourth signal $p0_1$. Similarly, the second bank has a first flip-flop F0 that provides an output fourth signal $a1_1$, a second flip-flop F1 that provides an output fourth signal $b1_1$, and so on until a sixteenth flip-flop F15 that provides an output fourth signal $p1_1$. Likewise, the sixteenth bank has a first flip-flop F0 that provides an output fourth signal $a15_1$, a second flip-flop F1 that provides an output fourth signal $b15_1$, and so on until a sixteenth flip-flop F15 that provides an output fourth signal $p15_1$. Flip-flops F0, F1, ..., F15 in each bank form an N3=16-bit shift register, and the N1 banks of flip-flops 1312 collectively form an N2=256-bit shift register.

In an embodiment, the group select signal sel is used to select either the first input or the second input of each MUX 1314 as the D input of the associated flip-flop 1312. For example, if sel=0000 (0), the first input (one of first control signals sf0, sf1, sf2, ..., sf15) of the first MUX 1314 of each bank is selected as the D input of the associated flip-flop 1312. For all other MUXES 1314 in the bank, the second input (Q output of the associated flip-flip 1312) is selected as the D input of the associated flip-flop 1312. Similarly, if sel=0101 (5), the first input (one of first control signals sf0, sf1, sf2, ..., sf15) of the fifth MUX 1314 of each bank is selected as the D input of the associated flip-flop 1312. For all other MUXES 1314 in the bank, the second input (Q output of the associated flip-flip 1312) is selected as the D input of the associated flip-flop 1312.

In this regard, the group select signal sel selects a group of flip-flops 1312 that will update their Q output with first control signals sf0, sf1, sf2, . . . , sf15 on the next falling edge of first clock clk1. For example, if sel=0000 (0), on the next falling edge of first clock signal clk1, the F0 flip-flops 1312 will shift the values of first control signals sf0, sf1, sf2, . . . , sf15 as the Q output fourth signals $a0_1$, $a1_1$, $a1_2$, . . . , $a15_1$, respectively. The Q output fourth signals of all other flip-flops 1312 remain unchanged.

Likewise, if sel=1110 (14), on the next falling edge of first clock signal clk1, the F0 flip-flops 1312 will shift the values of first control signals sf0, sf1, sf2, . . . , sf15 as the Q output fourth signals $o0_1$, $o1_1$, $o1_2$, . . . , $o15_1$, respectively. The Q output fourth signals of all other flip-flops 1312 remain unchanged.

In the embodiment of FIG. 15B, second sub-circuit 1300b includes N2=256 flip-flops 1316 (labeled H0-H255). In an embodiment, flip-flops 1316 are falling edge-triggered D-flip-flops, although other flip-flops may be used. Each flip-flop 1316 includes a data (D) input, a clock input, a reset input and an output (Q).

In an embodiment, each of flip-flops 1316 have a D input coupled to a corresponding one of fourth signals $a0_1$, $a1_1$, . . . , $a14_1$, $a15_1$, $b0_1$, $b1_1$, . . . , $b14_1$, $b15_1$, . . . , $o14_1$, $o15_1$, $p0_1$, . . . , $p14_1$, $p15_1$ at third physical signal lines 1308 (Bus2), and have a Q output coupled to a corresponding one of converted control signals $a0_2$, $a1_2$, . . . , $a14_2$, $a15_2$, $b0_2$, $b1_2$, . . . , $b14_2$, $b15_2$, . . . , $o14_2$, $o15_2$, $p0_2$, $p1_2$, . . . , $p14_2$, $p15_2$, respectively, at second physical signal lines 1304 (Bus 3).

In an embodiment, on the next falling edge of second clock signal clk1, flip-flops 1316 shift the values of fourth signals $a0_1$, $a1_1$, . . . , $a14_1$, $a15_1$, $b0_1$, $b1_1$, . . . , $b14_1$, $b15_1$, . . . , $o14_1$, $o15_1$, $p0_1$, $p1_1$, . . . , $p14_1$, $p15_1$ as the Q output converted control signals $a0_2$, $a1_2$, . . . , $a14_2$, $a15_2$, $b0_2$, $b1_2$, . . . , $b14_2$, $b15_2$, . . . , $o14_2$, $o15_2$, $p0_2$, $p1_2$, . . . , $p14_2$, $p15_2$, respectively. In this regard flip-flops H0, H1, . . . , H255 form a N2=256-bit shift register.

Accordingly, it can be seen that, in one embodiment, an apparatus is provided that includes a memory structure of non-volatile memory cells, a first processor, a first circuit and a conversion circuit. The first processor is configured to generate first control signals to control the first circuit to perform memory operations on the non-volatile memory cells. A first number of first physical signal lines is configured to deliver the first control signals to the conversion circuit. A second number of second physical signal lines is configured to deliver converted control signals to the first circuit. The conversion circuit is coupled by the first number of first physical signal lines to the first processor and is coupled by the second number of second physical signal lines to the first circuit. The conversion circuit is configured to convert the first control signals to the converted control signals, and output the converted control signals to the first circuit. The first number of first physical signal lines is less than the second number of second physical signal lines to reduce the first number of first physical signal lines coupled between the first processor and the first circuit.

In another embodiment, an apparatus is provided that includes a plurality of memory cells coupled to a plurality of word lines and a plurality of bit lines, and a voltage source circuit configured to apply voltages to the word lines and the bit lines, and a microcontroller circuit. The microcontroller circuit includes a first control circuit configured to provide a plurality of first control signals at a first plurality of physical signal lines to the voltage source circuit, and implement a serial-in and parallel-out pipeline to reduce a number of the first plurality of physical signal lines. The first control signals control timing of memory operations performed on the plurality of memory cells.

In another embodiment, a method is provided that includes providing a microcontroller coupled to a plurality of memory cells, the microcontroller including a first processor, executing a first set of instructions on the first processor to provide first control signals over a plurality of first physical signal lines to a first circuit configured to apply voltages to the plurality of memory cells, reducing a number of the first physical signal lines by storing first control signal data from the first physical signal lines in a first set of registers, shifting the stored first control signal data from the first set of registers to a second set of registers, and providing the first control signal data from the second set of registers over second physical signal lines to the first circuit.

In another embodiment, a system is provided that includes a memory structure, a first circuit, a state machine, and a conversion circuit. The memory structure includes non-volatile memory cells. The first circuit includes a voltage generator connected to the memory structure. The state machine is configured to generate first control signals coupled via physical signal lines to the first circuit to control voltages applied to the memory structure by the voltage generator to perform memory operations on the non-volatile memory cells. The conversion circuit includes a two-stage pipeline structure coupled between the state machine and the first circuit, the two-stage pipeline structure configured to reduce a number of the physical signal lines.

In another embodiment, an apparatus is provided that includes a microcontroller coupled to a plurality of memory cells, the microcontroller comprising a first processor configured to provide first control signals over a plurality of first physical signal lines to a first circuit comprising a voltage generator coupled to the plurality of memory cells, and a means for reducing a number of the first plurality of physical signal lines in the memory circuit. The means for reducing includes a means for prefetching first control signals from the first plurality of physical signal lines, a means for storing the prefetched first control signals during a first time interval, a means for fetching the stored first control signals during a second time interval, and a means for providing the fetched first control signals to the plurality of memory cells.

In an embodiment, the means for reducing a number of the first plurality of physical signal lines in the memory circuit includes one or more of conversion circuit 1300, first sub-circuit 1300a, second sub-circuit 1300b, an electrical circuit, an ASIC, an FPGA, a digital logic circuit, an analog circuit, a combination of discrete circuits, gates, and/or a portion of a program code (e.g., software or firmware) executable by a (micro)processor or processing circuitry (or one or more processors). However, the means for reducing a number of the first plurality of physical signal lines in the memory circuit could include other hardware and/or software.

In an embodiment, the means for prefetching first control signals from the first plurality of physical signal lines includes one or more of conversion circuit 1300, first sub-circuit 1300a, an electrical circuit, an ASIC, an FPGA, a digital logic circuit, an analog circuit, a combination of discrete circuits, gates, and/or a portion of a program code (e.g., software or firmware) executable by a (micro)processor or processing circuitry (or one or more processors). However, the means for prefetching first control signals from the first plurality of physical signal lines could include other hardware and/or software.

In an embodiment, the means for storing the prefetched first control signals during a first time interval includes one or more of conversion circuit 1300, first sub-circuit 1300*a*, an electrical circuit, an ASIC, an FPGA, a digital logic circuit, an analog circuit, a combination of discrete circuits, gates, and/or a portion of a program code (e.g., software or firmware) executable by a (micro)processor or processing circuitry (or one or more processors). However, the means for storing the prefetched first control signals during a first time interval could include other hardware and/or software.

In an embodiment, the means for fetching the stored first control signals during a second time interval includes one or more of conversion circuit 1300, second sub-circuit 1300*b*, an electrical circuit, an ASIC, an FPGA, a digital logic circuit, an analog circuit, a combination of discrete circuits, gates, and/or a portion of a program code (e.g., software or firmware) executable by a (micro)processor or processing circuitry (or one or more processors). However, the means for fetching the stored data during a second time interval could include other hardware and/or software.

In an embodiment, the means for providing the fetched first control signals to the plurality of memory cells includes one or more of conversion circuit 1300, second sub-circuit 1300*b*, an electrical circuit, an ASIC, an FPGA, a digital logic circuit, an analog circuit, a combination of discrete circuits, gates, and/or a portion of a program code (e.g., software or firmware) executable by a (micro)processor or processing circuitry (or one or more processors). However, the means for providing the fetched data to the plurality of memory cells could include other hardware and/or software.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a memory structure comprising non-volatile memory cells;
   a first processor configured to execute first instructions to generate first control signals on a first number of first physical signal lines to control voltages applied to the memory structure by a first circuit to perform memory operations on the non-volatile memory cells;
   a second processor configured to execute second instructions to generate second control signals to control a second circuit to sense a condition of the non-volatile memory cells in response to the applied voltages; and
   a conversion circuit comprising a plurality of registers coupled by the first physical signal lines to the first processor to receive the first control signals, the conversion circuit configured to convert the first control signals to converted control signals that are output from the conversion circuit on a second number of second physical signal lines to the first circuit, the first number less than the second number to reduce the first number of first physical signal lines coupled between the first processor and the first circuit.

2. The apparatus of claim 1, wherein the conversion circuit comprises a serial-in and parallel-out pipeline circuit.

3. The apparatus of claim 1, wherein the conversion circuit comprises a two-stage pipeline structure.

4. The apparatus of claim 1, wherein the conversion circuit comprises a pre-fetch circuit coupled to a fetch circuit.

5. The apparatus of claim 1, wherein the first control signals comprise signals controlling timing of voltages applied by the first circuit to the memory structure.

6. The apparatus of claim 1, wherein the first processor is further configured to arrange the first physical signal lines into groups of first control signals, and provide the first control signals one group at a time on the first physical signal lines.

7. The apparatus of claim 1, wherein the apparatus further comprises an integrated circuit comprising a first level comprising the memory structure, and a second level comprising the first processor and the second processor, wherein the first level and second level comprise different levels.

8. The apparatus of claim 1, wherein the memory structure comprises a plurality of memory planes, each comprising the first circuit.

9. The apparatus of claim 1, wherein the first processor and the second processor are disposed under the memory structure.

10. An apparatus comprising:
    a plurality of memory cells coupled to a plurality of word lines and a plurality of bit lines, and a voltage source circuit configured to apply voltages to the word lines and the bit lines; and
    a microcontroller circuit comprising:
       a first control circuit configured to:
          provide a plurality of first control signals at a first plurality of physical signal lines to the voltage source circuit, wherein the first control signals control timing of memory operations performed on the plurality of memory cells; and
          implement a serial-in and parallel-out pipeline to reduce a number of the first plurality of physical signal lines; and
       a second control circuit configured to provide a plurality of second control signals to control a second circuit to sense a condition of the plurality of memory cells in response to the memory operations performed on the plurality of memory cells.

11. The apparatus of claim 10, wherein the serial-in and parallel-out pipeline comprises a two-stage pipeline structure.

12. The apparatus of claim 10, wherein the serial-in and parallel-out pipeline comprises a pre-fetch circuit coupled to a fetch circuit.

13. The apparatus of claim 10, wherein the serial-in and parallel-out pipeline comprises a first plurality of shift registers coupled to a second plurality of shift registers.

14. The apparatus of claim 10, wherein the second circuit comprises data latch circuits.

15. The apparatus of claim 10, wherein the plurality of memory cells comprise a plurality of memory planes, each coupled to the first plurality of physical signal lines.

16. The apparatus of claim 10, wherein the controller circuit is disposed under the memory core circuit.

17. A method comprising:
providing a microcontroller coupled to a plurality of memory cells, the microcontroller comprising a first processor and a second processor;
executing a first set of instructions on the first processor to provide first control signals over a plurality of first physical signal lines to a first circuit configured to apply voltages to the plurality of memory cells;
executing a second set of instructions on the second processor to provide second control signals to a second circuit configured to sense a memory state of the plurality of memory cells;
reducing a number of the first physical signal lines by:
storing first control signal data from the first physical signal lines in a first set of registers;
shifting the stored first control signal data from the first set of registers to a second set of registers; and
providing the first control signal data from the second set of registers over second physical signal lines to the first circuit.

18. The method of claim 17, further comprising implementing a serial-in and parallel-out pipeline to reduce the number of first physical signal lines in the memory circuit.

19. A system comprising:
a memory structure comprising non-volatile memory cells;
a first circuit comprising a voltage generator connected to the memory structure;
a state machine configured to generate first control signals coupled via physical signal lines to the first circuit to control voltages applied to the memory structure by the voltage generator to perform memory operations on the non-volatile memory cells;
a second circuit configured to generate second control signals coupled to a a second circuit configured to sense a condition of the non-volatile memory cells in response to the applied voltage; and
a conversion circuit comprising a two-stage pipeline structure coupled between the state machine and the first circuit, the two-stage pipeline structure configured to reduce a number of the physical signal lines.

20. The system of claim 19, wherein the plurality of memory die comprise a plurality of memory planes, each coupled to the physical signal lines.

* * * * *